US008546926B2

(12) United States Patent
Kawanami et al.

(10) Patent No.: US 8,546,926 B2
(45) Date of Patent: Oct. 1, 2013

(54) POWER CONVERTER

(75) Inventors: Yasuhiko Kawanami, Fukuoka (JP); Masato Higuchi, Fukuoka (JP); Akira Sasaki, Fukuoka (JP); Akira Soma, Fukuoka (JP); Tasuku Isobe, Fukuoka (JP); Tetsuya Ito, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 0 days.

(21) Appl. No.: 13/364,606

(22) Filed: Feb. 2, 2012

(65) Prior Publication Data
US 2012/0211767 A1   Aug. 23, 2012

Related U.S. Application Data

(63) Continuation of application No. PCT/JP2010/062564, filed on Jul. 27, 2010.

(30) Foreign Application Priority Data

Aug. 3, 2009 (JP) ................................ 2009-180598

(51) Int. Cl.
*H01L 23/02* (2006.01)
(52) U.S. Cl.
USPC ........... 257/678; 257/687; 257/690; 257/723; 257/734; 257/E23.001; 257/E23.079
(58) Field of Classification Search
USPC ................... 257/678–734, E23.001–E23.194
See application file for complete search history.

(56) References Cited

U.S. PATENT DOCUMENTS

| | | | |
|---|---|---|---|
| 6,101,114 A * | 8/2000 | Kijima et al. ................. | 363/132 |
| 2005/0023658 A1 | 2/2005 | Tabira et al. | |
| 2005/0161785 A1 | 7/2005 | Kawashima et al. | |
| 2010/0117219 A1 | 5/2010 | Oka et al. | |

FOREIGN PATENT DOCUMENTS

| | | |
|---|---|---|
| JP | 09-232341 | 9/1997 |
| JP | 2005-51130 | 2/2005 |
| JP | 2005-217072 | 8/2005 |
| JP | 2007-273884 | 10/2007 |
| JP | 2008-103623 | 5/2008 |
| JP | 2010-129550 | 6/2010 |
| WO | WO 2008/090734 | 7/2008 |

OTHER PUBLICATIONS

International Search Report for corresponding International Application No. PCT/JP2010/062564, Sep. 7, 2010.

* cited by examiner

*Primary Examiner* — Jasmine Clark
(74) *Attorney, Agent, or Firm* — Ditthavong Mori & Steiner, P.C.

(57) ABSTRACT

The present power converter includes a power conversion semiconductor device, an electrode connection conductor which electrically connects multiple electrodes having the same potential, and also has a generally flat upper surface for electrically connecting to an exterior portion, and a sealing material provided so as to cover the power conversion semiconductor device, and also to expose the generally flat upper surface of the electrode connection conductor.

19 Claims, 34 Drawing Sheets

FIRST EMBODIMENT

FIRST EMBODIMENT

SECOND EMBODIMENT

EIGHTH EMBODIMENT

ELEVENTH EMBODIMENT

POWER CONVERTER

CROSS REFERENCES TO RELATED APPLICATIONS

The present application is a continuation application of PCT/JP2010/062564, filed Jul. 27, 2010, which claims priority to Japanese Patent Application No. 2009-180598, filed Aug. 3, 2009. The contents of these applications are incorporated herein by reference in their entirety.

BACKGROUND OF THE INVENTION

1. Field of the Invention

Disclosed embodiments relate to a power converter.

2. Description of the Related Art

Examples of power converters include a power converter described in Japanese Unexamined Patent Application Publication No. 2008-103623. This semiconductor device (power converter) includes an IGBT (power conversion semiconductor device), a lead frame electrically connected to the IGBT, and a mold resin to be provided so as to include the IGBT and lead frame therein. This semiconductor device is formed so that the lead frame protrudes from the side face of the mold resin so as to electrically connect to an external device.

With such a semiconductor device, the lead frame protrudes from the side face of the mold resin, and accordingly, the semiconductor device increases in size equivalent to the worth thereof, and as a result thereof, it is difficult to realize reduction in size.

SUMMARY OF THE INVENTION

According to one aspect of the present disclosure, there is provided a power converter including a power converter main unit and a wiring substrate, the power converter main unit includes multiple power conversion semiconductor devices having electrodes, an electrode connection conductor configured to electrically connect, of the electrodes of the multiple power conversion semiconductor devices, the multiple electrodes having the same potential, and also to have a generally flat upper surface for electrically connecting to an exterior portion, in an upper position than the plurality of power conversion semiconductor devices, and a sealing material made up of a resin which covers the power conversion semiconductor devices; with the generally flat upper surface of the electrode connection conductor being configured so as to expose from the upper surface of the sealing material; and with a wiring substrate being electrically connected to the generally flat upper surface of the electrode connection conductor which is exposed from the upper surface of the sealing material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
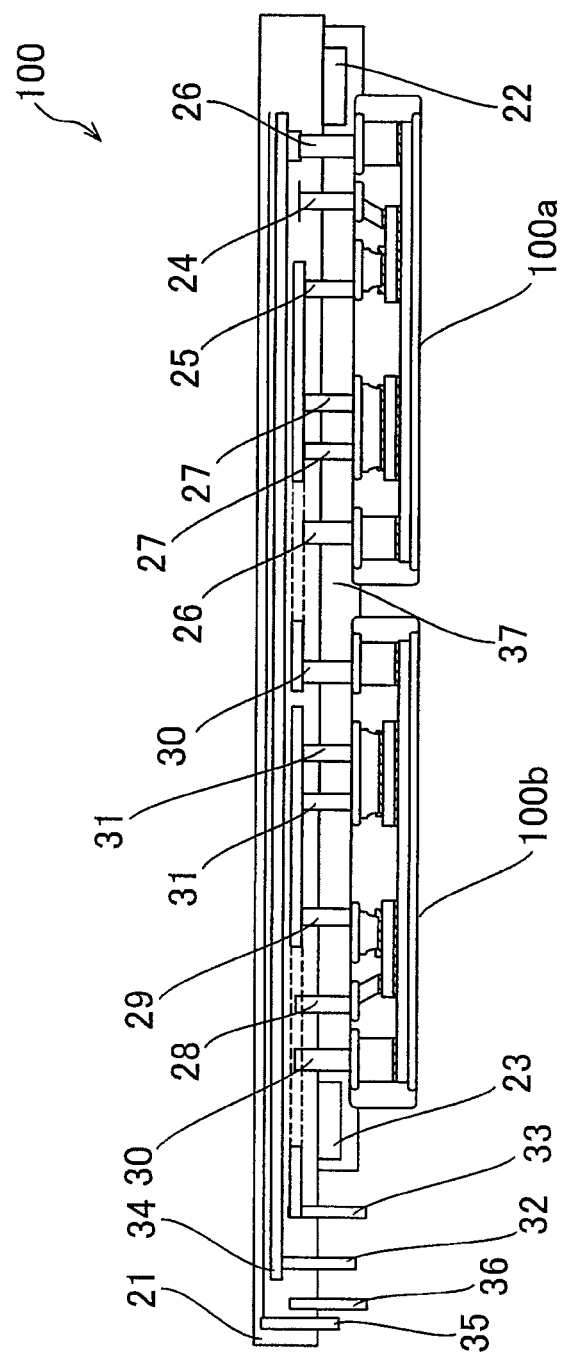
FIG. 1 is a cross-sectional view of a power module indicating a first embodiment.

Embodiments will now be described with reference to the accompanying drawings, wherein like reference numerals designate corresponding or identical elements throughout the various drawings.

First Embodiment

The configuration of a power module 100 indicating a first embodiment will be described with reference to FIGS. 1 through 7. With the first embodiment, description will be made regarding a case where a power conversion element according to the embodiment has been applied to the power module 100.

As illustrated in FIG. 1, the power module 100 according to the first embodiment is configured of a wiring substrate 21, and two power module main units 100a and 100b. Note that the power module main units 100a and 100b are an example of "power converter" and "power converter main unit".

The detailed configuration of the wiring substrate 21 will be described with reference to FIG. 1. The wiring substrate 21 is made up of glass epoxy, ceramics, polyimide, or the like. A P-side gate driver IC 22 and an N-side gate driver IC 23 are implemented on the lower surface of the wiring substrate 21. The power module 100 makes up a three-phase inverter circuit. The power module main unit 100a serves as an upper side arm of the three-phase inverter circuit. The power module main unit 100b serves as a lower side arm of the three-phase inverter circuit.

The power module main unit 100a is attached to the wiring substrate 21 via a P-side gate metal terminal 24, a P-side source metal terminal 25, a P-side drain metal terminal 26, and a P-side anode metal terminal 27. The P-side gate metal terminal 24, P-side source metal terminal 25, P-side drain metal terminal 26, and P-side anode metal terminal 27 are formed in a pin shape (cylindrical shape). That is to say, a generally flat upper surface 4a (upper surface 5a, upper surface 6a, upper surface 7a) of a gate terminal 4 (source terminal 5, drain and cathode terminal 6, anode terminal 7) exposed from the surface of a later-described resin material 10 (see FIG. 2) are electrically connected to the wiring substrate 21 via the P-side gate metal terminal 24 (P-side source metal terminal 25, P-side drain metal terminal 26, P-side anode metal terminal 27). The power module main unit 100b is attached to the wiring substrate 21 via an N-side gate metal terminal 28, an N-side source metal terminal 29, an N-side drain metal terminal 30, and an N-side anode metal terminal 31. The N-side gate metal terminal 28, N-side source metal terminal 29, N-side drain metal terminal 30, and N-side anode metal terminal 31 are formed in a pin shape (cylindrical shape). That is to say, the generally flat upper surface 4a (upper surface 5a, upper surface 6a, upper surface 7a) of the gate terminal 4 (source terminal 5, drain and cathode terminal 6, anode terminal 7) exposed from the surface of a later-described resin material 10 (see FIG. 2) are electrically connected to the wiring substrate 21 via the N-side gate metal terminal 28 (N-side source metal terminal 29, N-side drain metal terminal 30, N-side anode metal terminal 31).

A P-side metal terminal 32 and an N-side metal terminal 33 are provided to one edge side of the wiring substrate 21. The P-side metal terminal 32 is connected the P-side drain metal terminal 26 of the power module main unit 100a via a busbar-shaped wiring 34 made up of an electroconductive metal plate provided to the inner portion of the wiring substrate 21. The P-side source metal terminal 25 and P-side anode metal terminal 27 of the power module main unit 100a are connected to the N-side drain metal terminal 30 of the power module main unit 100b via a wiring 34 provided to the inner portion of the wiring substrate 21. The N-side source metal terminal 29 and N-side anode metal terminal 31 of the power module main unit 100b are connected to the N-side metal terminal 33 provided to one edge side of the wiring substrate 21 via the wiring 34 provided to the inner portion of the wiring substrate 21.

The P-side gate driver IC 22 is disposed near the P-side gate metal terminal 24 of the power module main unit 100a, and also between the wiring substrate 21 and the power module main unit 100a. That is to say, the interval between the wiring substrate 21 and the power module main unit 100a is configured so as to be thicker than the thickness of the P-side gate driver IC 22. The P-side gate driver IC 22 is connected to a P-side control signal terminal 35 provided to one edge side of the wiring substrate 21.

The N-side gate driver IC 23 is disposed near the N-side gate metal terminal 28 of the power module main unit 100b, and also between the wiring substrate 21 and the power module main unit 100b. That is to say, the interval between the wiring substrate 21 and the power module main unit 100b is configured so as to be thicker than the thickness of the N-side gate driver IC 23. Also, the N-side gate driver IC 23 is connected to an N-side control signal terminal 36 provided to one edge side of the wiring substrate 21.

The P-side gate driver IC 22 and N-side gate driver IC 23 are disposed near the metal terminals of the power module main unit 100*a* and power module main unit 100*b* respectively, whereby wiring inductance can be reduced. Thus, permissible dose as to disturbance such as noise and so forth is increased. Also, with later-described multiple semiconductor devices 52*a*, 52*b*, 53*a*, and 53*b* (see FIGS. 12, 15, 18, 27, and 30), switching operation can be performed generally at the same timing while suppressing irregularities.

The wiring substrate 21, and the power module main units 100*a* and 100*b* are disposed with predetermined distance (space). An insulating resin material 37 having a sealing function is filled so as to fill space between the wiring substrate 21, and the power module main units 100*a* and 100*b*. Thus, the wiring substrate 21, and the power module main units 100*a* and 100*b* are fixed. Thus, progress of corrosion of the P-side gate metal terminal 24, P-side source metal terminal 25, P-side drain metal terminal 26, P-side anode metal terminal 27, N-side gate metal terminal 28, N-side source metal terminal 29, N-side drain metal terminal 30, and N-side anode metal terminal 31 which connect the wiring substrate 21, and the power module main units 100*a* and 100*b* can be suppressed. A suitable material is selected as the material of the insulating resin material 37 according to the heating temperature and so forth of a semiconductor device 2 and a semiconductor device 3.

Next, the detailed configuration of the power module main unit 100*a* (100*b*) will be described with reference to FIGS. 2 through 7.

Figure 2:
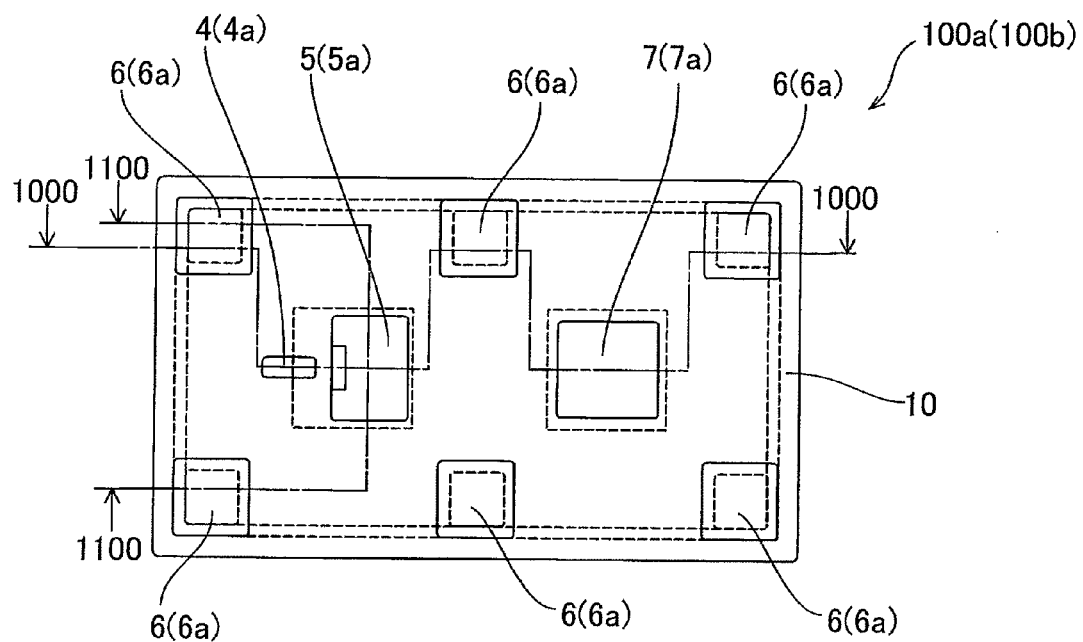
FIG. 2 is a plan view of a power module main unit indicating the first embodiment.
Figure 3:
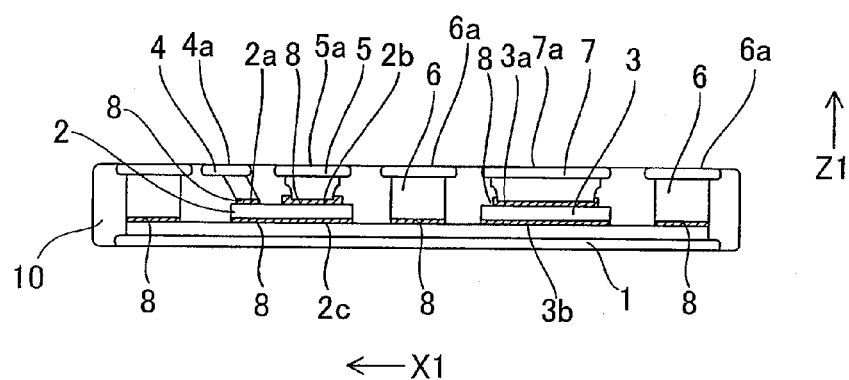
FIG. 3 is a cross-sectional view taken along 1000-1000 line in FIG. 2.
Figure 4:
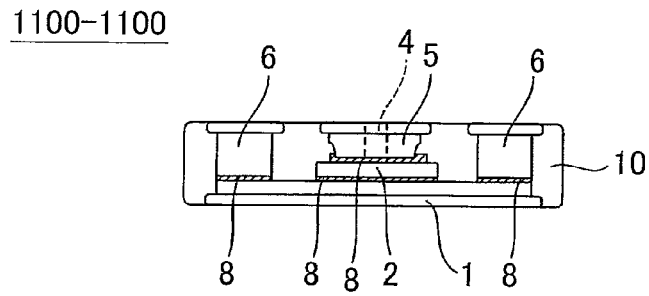
FIG. 4 is a cross-sectional view taken along 1100-1100 line in FIG. 2.

As illustrated in FIGS. 2 through 4, with the power module main unit 100*a* (100*b*), a drain and cathode electrode heat sink 1, a semiconductor device 2, a semiconductor device 3, a gate terminal 4, a source terminal 5, a drain and cathode terminal 6, and an anode terminal 7 are provided. The drain and cathode electrode heat sink 1, gate terminal 4, source terminal 5, drain and cathode terminal 6, and anode terminal 7 are made up of metal not including an insulator such as copper (Cu), copper and molybdenum (CuMo), or the like. The drain and cathode electrode heat sink 1 is made up of a metal plate. The semiconductor device 2 according to the first embodiment is an FET (field-effect transistor) of silicon carbide (SiC) which can perform higher temperature operation than a Si-based semiconductor. The semiconductor device 2 includes, as illustrated in FIG. 3, a control electrode 2*a* and a source electrode 2*b* which are provided to the principal surface of the semiconductor device 2, and a drain electrode 2*c* which is provided to the rear face. The semiconductor device 2 is an example of "power conversion semiconductor device" and "voltage driving transistor element". The source electrode 2*b* is an example of "first electrode". The drain electrode 2*c* is an example of "second electrode". The drain and cathode electrode heat sink 1 is an example of "second electrode conductor" and "second metal plate".

The semiconductor device 3 is made up of a first recovery diode (FRD) of silicon carbide (SiC) which can operate at higher temperature than a Si-based semiconductor, and includes an anode electrode 3*a* and a cathode electrode 3*b*. The cathode electrode 3*b* of the semiconductor device 3 is electrically connected to the drain electrode 2*c* of the semiconductor device 2, and the semiconductor device 3 has a function as a reflux diode (see FIG. 7). The anode electrode 3*a* is an example of "first diode electrode". The cathode electrode 3*b* is an example of "second diode electrode". The semiconductor device 3 is an example of "power conversion semiconductor device" and "reflux diode element".

As illustrated in FIG. 3, each of the semiconductor device 2 and semiconductor device 3 is joined onto the surface of the drain and cathode electrode heat sink 1 via a joining material 8 made up of solder. The drain electrode 2*c* of the semiconductor device 2 is electrically connected to the drain and cathode electrode heat sink 1. The cathode electrode 3*b* of the semiconductor device 3 is electrically connected to the drain and cathode electrode heat sink 1. That is to say, with the first embodiment, the drain and cathode electrode heat sink 1 is configured so as to connect the drain electrode 2*c* of the rear face of the semiconductor device 2, and the cathode electrode 3*b* of the rear face of the semiconductor device 3 which have the same potential. In the case of employing this type of semiconductor device, temperature at the joined portion increases up to near around 250° C. Therefore, the joining material 8 is formed of solder such as Au-20Sn, Zn-30Sn, Pb-5Sn, or the like which are high in heat resistance. Also, in the event that the temperature at the joined portion increases up to near around 400° C., the joining material 8 is formed of organic layer-coated nano-Ag particles which are further high in heat resistance, or the like.

The gate terminal 4 is joined onto the surface of the semiconductor device 2 (onto the gate electrode 2*a*) via the joining material 8. With the first embodiment, the gate terminal 4 has a pillar shape, and is formed so as to extend from the surface (upper surface) of the semiconductor device 2 to the upward direction (arrow Z1 direction) of the power module main unit 100*a* (100*b*). The gate terminal 4 is formed so as to extend toward the outer side (arrow X1 direction) of the power module main unit 100*a* (100*b*). The upper surface 4*a* of the gate terminal 4 is generally flat, and also has a generally rectangular shape (see FIG. 2) as viewed in a planar manner. The gate terminal 4 has a function for radiating heat that the semiconductor device 2 generates, from the upper surface 4*a*. The gate terminal 4 is an example of "electrode connection conductor" and "first electrode conductor".

The source terminal 5 is joined onto the surface (onto source electrode 2*b*) of the semiconductor device 2 via the joining material 8. With the first embodiment, the source terminal 5 has a pillar shape, and is formed so as to extend from the surface of the semiconductor device 2 to the upward direction (arrow Z1 direction) of the power module main unit 100*a* (100*b*). The upper surface 5*a* of the source terminal 5 is generally flat, and also has a generally rectangular shape (see FIG. 2) as viewed in a planar manner. The source terminal 5 has a function for radiating heat that the semiconductor device 2 generates, from the upper surface 5*a*. The source terminal 5 is an example of "electrode connection conductor", "first electrode conductor", and "transistor electrode conductor".

The drain and cathode terminal 6 is joined onto the surface of the drain and cathode electrode heat sink 1 via the joining material 8. With the first embodiment, the drain and cathode terminal 6 has a pillar shape, and disposed in a position separated from the semiconductor device 2 and semiconductor device 3. Six drain and cathode terminals 6 are disposed with a predetermined interval along near the edge portion (see FIG. 2) of the power module main unit 100*a* (100*b*). The drain and cathode terminals 6 are disposed so as to extend more upward than the semiconductor device 2 and semiconductor device 3.

The upper surfaces 6*a* of the drain and cathode terminals 6 are generally flat, and also have a generally rectangular shape (see FIG. 2) as viewed in a planar manner. The drain and cathode terminals 6 function to dissipate heat, generated by the semiconductor device 2, from the upper surfaces 6*a*. The heights of the upper surfaces 6*a* of the six drain and cathode terminals 6 are generally the same. The drain and cathode terminals 6 are an example of "electrode connection conductor" and "second connection conductor".

The anode terminal 7 is joined onto the surface (onto the anode electrode 3*a*) of the semiconductor device 3 via the joining material 8. With the first embodiment, the anode terminal 7 has a pillar shape, and is formed so as to extend from the surface of the semiconductor device 3 to the upward direction (arrow Z1 direction) of the power module main unit 100*a* (100*b*). The upper surface 7*a* of the anode terminal 7 is generally flat, and also has a generally rectangular shape (see FIG. 2) as viewed in a planar manner. The anode terminal 7 has a function for radiating heat that the semiconductor device 3 generates, from the upper surface 7*a*. The anode terminal 7 is an example of "electrode connection conductor", "first electrode conductor", and "diode electrode conductor".

The upper surface 4*a* of the gate terminal 4, the upper surface 5*a* of the source terminal 5, the upper surfaces 6*a* of the drain and cathode terminals 6, and the upper surface 7*a* of the anode terminal 7 are formed so as to have generally the same height.

With a common power module, joining between a semiconductor device and an electrode is performed by wiring with a conductor portion on an insulating circuit substrate such as a DBC via wire bonding. However, with such a wiring method, wiring inductance is relatively great, and accordingly, in the event of switching the power module with a high frequency, switching loss increases. Also, in the event of performing switching at high temperature, generation of heat due to increase in electric resistance occurs. On the other hand, with gate terminal 4, source terminal 5, and drain and cathode terminals 6 (anode terminal 7) according to the first embodiment are directly connected to the semiconductor device 2 (semiconductor device 3) via the joining material 8, and accordingly, the area of wiring increases as compared to a case where wire bonding is employed, and wiring inductance is reduced. Accordingly, even if the power module main unit 100*a* (100*b*) is subjected to switching with a high frequency, generation of heat and power loss due to increase in electric resistance can be reduced.

As illustrated in FIGS. 2 through 4, with the power module main unit 100*a* (100*b*), an insulating resin material 10 made up of silicon gel or the like is provided so as to cover the side faces of the semiconductor device 2, semiconductor device 3, gate terminal 4, source terminal 5, drain and cathode terminals 6, anode terminal 7, and drain and cathode electrode heat sink 1 in a surrounding manner. Thus, the resin material 10 makes up the outer face of the power module main unit 100*a* (100*b*). This resin material 10 has a function as an insulator which performs insulation between the semiconductor device 2, semiconductor device 3, gate terminal 4, source terminal 5, drain and cathode terminals 6, and anode terminal 7, and a function as a sealing material which suppresses incursion of moisture or the like as to the semiconductor device 2 and semiconductor device 3. The resin material 10 is an example of "sealing material".

Figure 5:
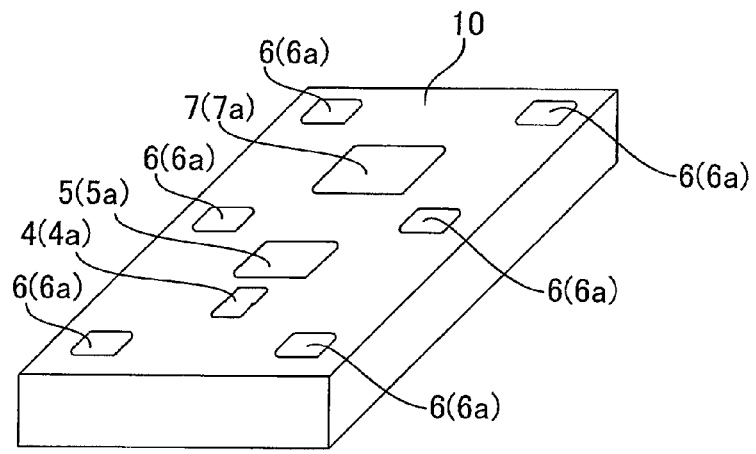
FIG. 5 is a perspective view as viewed from the surface side of the power module main unit indicating the first embodiment.
Figure 6:
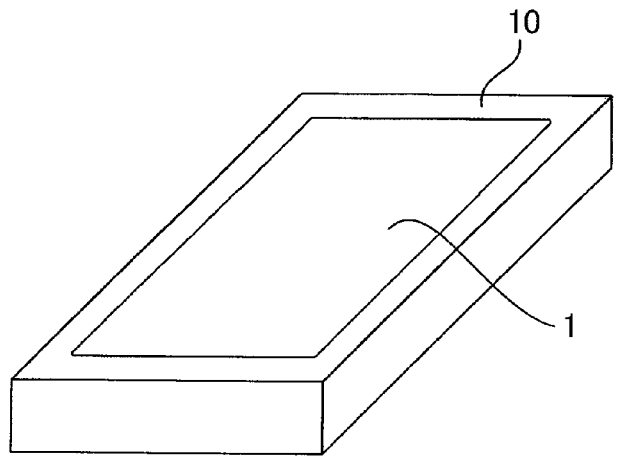
FIG. 6 is a perspective view as viewed from the rear face side of the power module main unit indicating the first embodiment.
Figure 7:
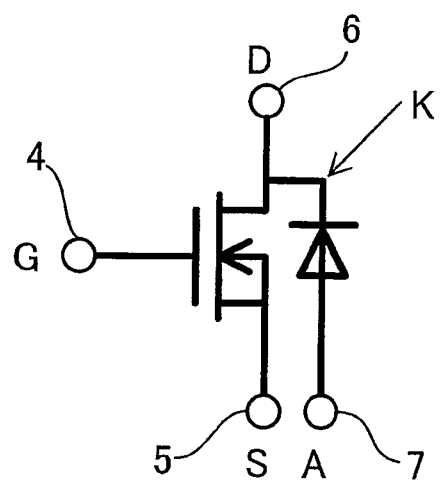
FIG. 7 is a circuit diagram of the power module main unit indicating the first embodiment.

As illustrated in FIG. 5, the resin material 10 is provided so that the upper surface 4*a* of the gate terminal 4, the upper surface 5*a* of the source terminal 5, the upper surfaces 6*a* of the drain and cathode terminals 6, and the upper surface 7*a* of the anode terminal 7 expose from the upper surface of the resin material 10. The upper surface of the resin material 10 has generally the same height as with the upper surface 4*a* of the gate terminal 4, the upper surface 5*a* of the source terminal 5, the upper surfaces 6*a* of the drain and cathode terminals 6, and the upper surface 7*a* of the anode terminal 7. An arrangement is made wherein electric connection is externally performed at the upper surface 4*a* of the gate terminal 4, the upper surface 5*a* of the source terminal 5, the upper surfaces 6*a* of the drain and cathode terminals 6, and the upper surface 7*a* of the anode terminal 7 which expose from the resin material 10 (power module main units 100*a* and 100*b*). As illustrated in FIG. 6, the drain and cathode electrode heat sink 1 is exposed from the rear face of the resin maternal 10.

With the first embodiment, electric connection is externally performed at the upper surface 4*a* (upper surface 5*a*, upper surfaces 6*a*, upper surface 7*a*) of the gate terminal 4 (source terminal 5, drain and cathode terminals 6, anode terminal 7) which is exposed from the upper surface of the power module main unit 100*a* (100*b*). Thus, wiring space used at the time of connecting between the power module main unit 100*a* (100*b*) and an external wiring can be reduced, and accordingly, reduction in the size of the power module main unit 100*a* (100*b*) can be performed. Also, the generally flat upper surface (upper surfaces 6*a*) of the drain and cathode electrode heat sink 1 (drain and cathode terminals 6) which electrically connects multiple electrodes having the same potential exposes. Thus, there can further be increased radiant quantity at the time of radiating heat generated from the semiconductor devices 2 and 3 upwards from the upper surface (upper surfaces 6*a*) of the drain and cathode electrode heat sink 1 (drain and cathode terminals 6) which has a relatively great plane area to which multiple electrodes having the same potential are connected. Also, the drain and cathode electrode heat sink 1 is configured so as to connect the drain electrode 2*c* of the semiconductor device 2, and the cathode electrode 3*b* of the semiconductor device 3 which have the same potential. Thus, the configuration is simple and also external electric connection can be readily performed as compared to a configuration wherein multiple conductors individually connected to multiple electrodes having the same potential are individually electrically connected to an exterior portion.

With the first embodiment, as described above, the gate terminal 4, source terminal 5, drain and cathode terminals 6, and anode terminal 7 have a pillar shape extending upwards. Also, the upper surface 4*a* of the gate terminal 4, the upper surface 5*a* of the source terminal 5, the upper surfaces 6*a* of the drain and cathode terminals 6, and the upper surface 7*a* of the anode terminal 7 are formed generally flat. Thus, the gate terminal 4, source terminal 5, drain and cathode terminals 6, and anode terminal 7 have a pillar shape, and accordingly, wiring inductance can be reduced in contrast to a case where the gate terminal 4, source terminal 5, drain and cathode terminals 6, and anode terminal 7 have, for example, a thin wire shape. As a result thereof, the semiconductor devices 2 and 3 can operate at higher speed. Also, according to the pillar-shaped gate terminal 4, source terminal 5, drain and cathode terminals 6, and anode terminal 7, radiant quantity can be increased as compared to a case of employing a thin wire-shaped electrode conductor, and accordingly, radiation performance can be improved.

With the first embodiment, as described above, the drain and cathode terminals 6 are disposed near the edge portion of the power module main unit 100*a* (100*b*). Also, the gate terminal 4 and source terminal 5 are disposed in the central portion of the power module 100*a* (100*b*). According to such a layout, distance between the drain and cathode terminals 6, gate terminal 4, and source terminal 5 can be increased, and insulation properties between the terminals can be improved.

With the first embodiment, the outer face of the power module 100*a* (100*b*) is made up of the resin material 10. In this way, the semiconductor device 2, semiconductor device 3, gate terminal 4, source terminal 5, drain and cathode terminals 6, and anode terminal 7 are covered with the resin material 10. Thus, even in the event that the semiconductor devices 2 and 3 have externally received impact, the resin material 10 absorbs the impact, whereby impact resistance can be improved. Also, the resin material 10 intervenes between the gate terminal 4, source terminal 5, drain and cathode terminals 6, and anode terminal 7, and accordingly, insulation properties between the terminals are improved.

With the first embodiment, as described above, the semiconductor devices 2 and 3 are configured of a semiconductor made up of SiC, whereby operation at higher temperature can be performed as compared to a case of a semiconductor made up of Si.

With the first embodiment, as described above, there is provided the wiring substrate 21 which electrically connects to the generally flat upper surface 4*a* (upper surface 5*a*, upper surfaces 6*a*, upper surface 7*a*) of the gate terminal 4 (source terminal 5, drain and cathode terminals 6, anode terminal 7) exposed from the upper surface of the resin material 10, whereby power can readily be supplied to the gate terminal 4 (source terminal 5, drain and cathode terminals 6, anode terminal 7) via the wiring substrate 21.

Second Embodiment

A second embodiment will be described with reference to FIGS. 8 through 11. With the present second embodiment, the upper surface 5*a* of the source terminal 5, and the upper surface 7*a* of the anode terminal 7, according to the first embodiment are electrically connected.

Figure 8:
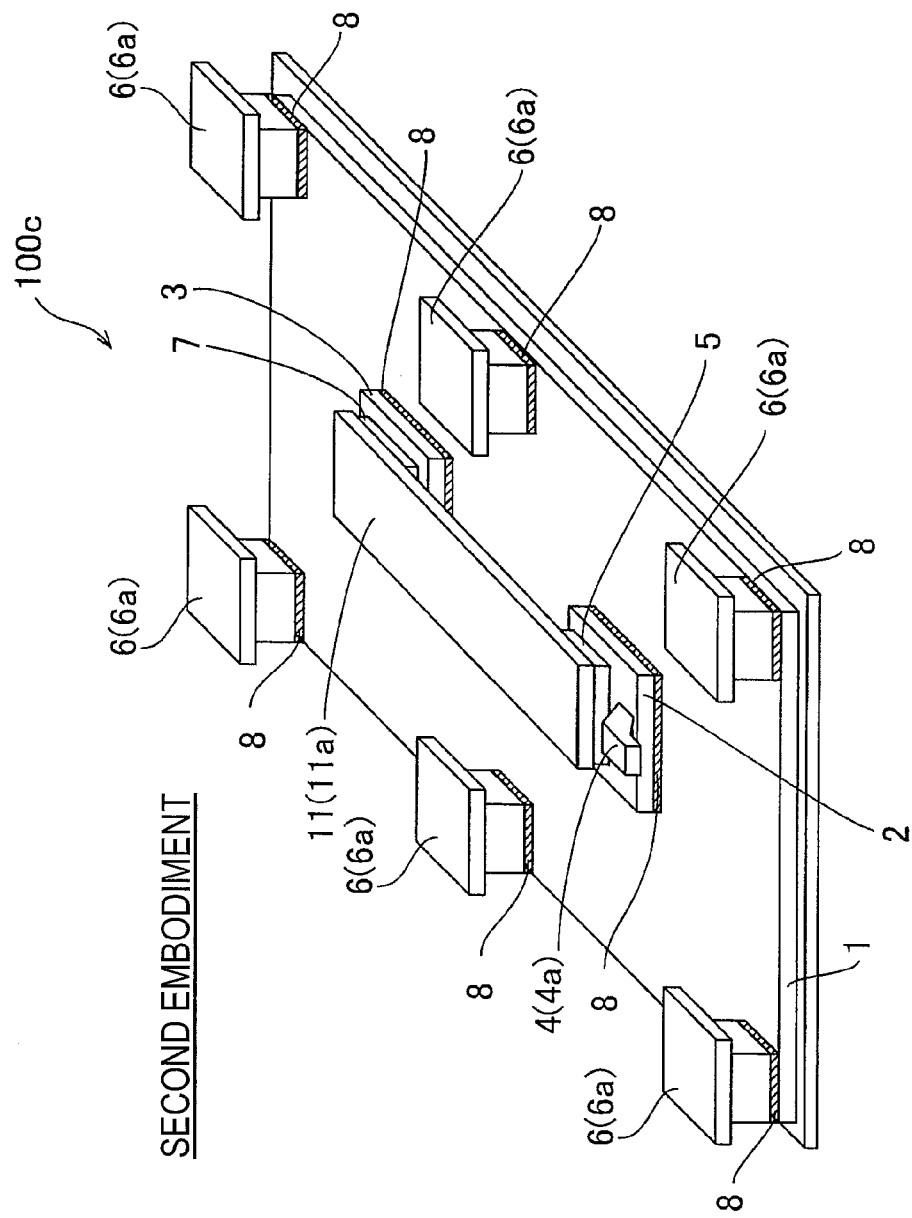
FIG. 8 is a perspective view as viewed from the surface side of a power module main unit in a state in which no resin material is formed indicating a second embodiment.

As illustrated in FIG. 8, with a power module main unit 100*c*, the upper surface 5*a* of the source terminal 5, and the upper surface 7*a* of the anode terminal 7 which have the same potential are connected with a connection metal plate 11. Thus, the source terminal 5 and anode terminal 7 are electrically connected (see FIG. 11). The upper surface 5*a* of the source terminal 5, and the upper surface 7*a* of the anode terminal 7 are connected to the connection metal plate 11 via the joining material 8 made up of solder. The connection metal plate 11 is disposed so as to straddle the generally flat upper surface 5*a* of the source terminal 5, and the generally flat upper surface 7*a* of the anode terminal 7. The upper surface 11*a* of the connection metal plate 11 is formed generally flat.

The drain and cathode electrode heat sink 1 is provided so as to connect the drain electrode 2*c* of the rear face of the semiconductor device 2, and the cathode electrode 3*b* of the rear face of the semiconductor device 3 which have the same potential. The six drain and cathode terminals 6 are disposed near the edge portion of the drain and cathode electrode heat sink 1 on the surface of the drain and cathode electrode heat sink 1 so as to be separated from the semiconductor devices 2 and 3. The upper surface 4*a* of the gate terminal 4, the upper surface 11*a* of the connection metal plate 11, and the upper surfaces 6*a* of the six drain and cathode terminals 6 have mutually generally the same height. The connection metal plate 11 is an example of "first connection conductor" and "first metal plate".

Figure 9:
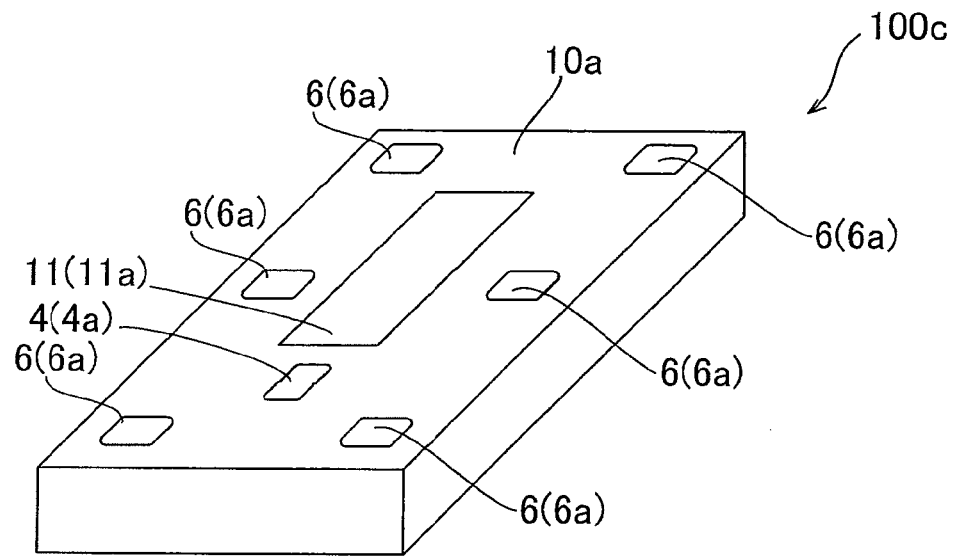
FIG. 9 is a perspective view as viewed from the surface side of the power module main unit indicating the second embodiment.

In FIG. 9, an insulating resin material 10*a* made up of silicon gel or the like is provided so as to cover the side faces of the semiconductor device 2, semiconductor device 3, gate terminal 4, connection metal plate 11, drain and cathode terminals 6, and drain and cathode electrode heat sink 1 in a surrounding manner. Thus, the resin material 10*a* makes up the outer surface of the power module main unit 100*c*. The resin material 10*a* is an example of "sealing material".

Figure 10:
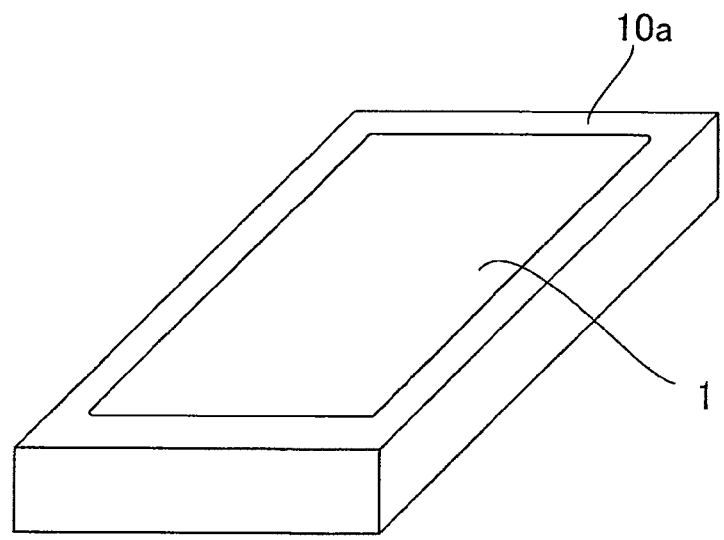
FIG. 10 is a perspective view as viewed from the rear face side of the power module main unit indicating the second embodiment.
Figure 11:
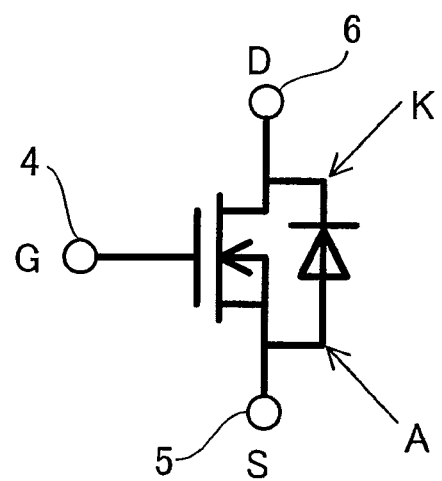
FIG. 11 is a circuit diagram of the power module main unit indicating the second embodiment.

The upper surface 4*a* of the gate terminal 4, the upper surface 11*a* of the connection metal plate 11, and the upper surfaces 6*a* of the drain and cathode terminals 6 are provided so as to expose from the upper surface of the resin material 10*a*. The upper surface of the resin material 10*a* has generally the same height as with the upper surface 4*a* of the gate terminal 4, the upper surface 11*a* of the connection metal plate 11, and the upper surfaces 6*a* of the drain and cathode terminals 6. An arrangement is made wherein electric connection is externally performed at the upper surface 4*a* of the gate terminal 4, the upper surface 11*a* of the connection metal plate 11, and the upper surfaces 6*a* of the drain and cathode terminals 6 which expose from the resin material 10*a*. As illustrated in FIG. 10, the drain and cathode electrode heat sink 1 are exposed from the rear face of the resin material 10*a*.

With the second embodiment, as described above, the upper surface 5*a* of the source terminal 5, and the upper surface 7*a* of the anode terminal 7 which have the same potential are connected by the connection metal plate 11. Thus, as compared to a case where the upper surface 5*a* of the source terminal 5, and the upper surface 7*a* of the anode terminal 7 are not connected by the connection metal plate 11, difference in the areas of the metal portion on the lower face side (drain and cathode electrode heat sink 1) and the metal portion on the upper surface side (the upper surface 4*a* of the gate terminal 4, the upper surface 11*a* of the connection metal plate 11, and the upper surfaces 6*a* of the drain and cathode terminals 6) of the power module main unit 100*c* is reduced. As a result thereof, strain (difference in dimension) caused due to thermal expansion of the metal portions between the lower face side and upper surface side of the power module main unit 100*c* is reduced. Thus, stress concentration serving as a generation factor of a crack can be eased at the joined portions of the power module main unit 100*c*. As a result thereof, the longer life and higher reliability of the power module main unit 100*c* can be realized. Also, the upper surface 5*a* of the source terminal 5, and the upper surface 7*a* of the anode terminal 7 which have the same potential are connected by the connection metal plate 11, whereby a radiation area from the upper surface can be increased as compared to a case where the upper surface 5*a* of the source terminal 5, and the upper surface 7*a* of the anode terminal 7 are not connected by the connection metal plate 11, and accordingly, radiant quantity can be increased.

With the second embodiment, as described above, the connection metal plate 11 is disposed so as to straddle the generally flat upper surface 5*a* of the source terminal 5, and the generally flat upper surface 7*a* of the anode terminal 7. Thus, the source terminal 5 and the anode terminal 7 can readily electrically be connected.

With the second embodiment, as described above, the upper surface 4*a* of the gate terminal 4, the upper surface 11*a* of the connection metal plate 11, and the upper surfaces 6*a* of the drain and cathode terminals 6 are provided so as to expose from the upper surface of the resin material 10*a*. Thus, heat generated from the semiconductor devices 2 and 3 can be radiated upwards from the upper surface 4*a* of the gate terminal 4, the upper surface 11*a* of the connection metal plate 11, and the supper surfaces 6*a* of the drain and cathode terminals 6, and radiant quantity at the time of radiating the heat can be increased. Also, the upper surface 4*a* of the gate terminal 4, the upper surface 11*a* of the connection metal plate 11, and the upper surfaces 6*a* of the drain and cathode terminals 6 are exposed from the upper surface of the resin material 10*a*, whereby external electric connection can readily be performed on the upper surface of the resin material 10*a*.

With the second embodiment, as described above, the upper surface 4a of the gate terminal 4, the upper surface 11a of the connection metal plate 11, and the upper surfaces 6a of the six drain and cathode terminals 6 are configured so as to have mutually generally the same height. Thus, a wiring substrate, an electrode, and so forth can readily be disposed at the time of performing external electric connection on the upper surfaces of the gate terminal 4, connection metal plate 11, and drain and cathode terminals 6. As a result thereof, external electric connection can readily be performed.

Third Embodiment

A third embodiment will be described with reference to FIGS. 12 through 14. With the present third embodiment, multiple semiconductor devices 2 and multiple semiconductor devices 3 are provided in contrast to the first embodiment wherein the above-mentioned single semiconductor device 2 and single semiconductor device 3 are provided.

Figure 12:
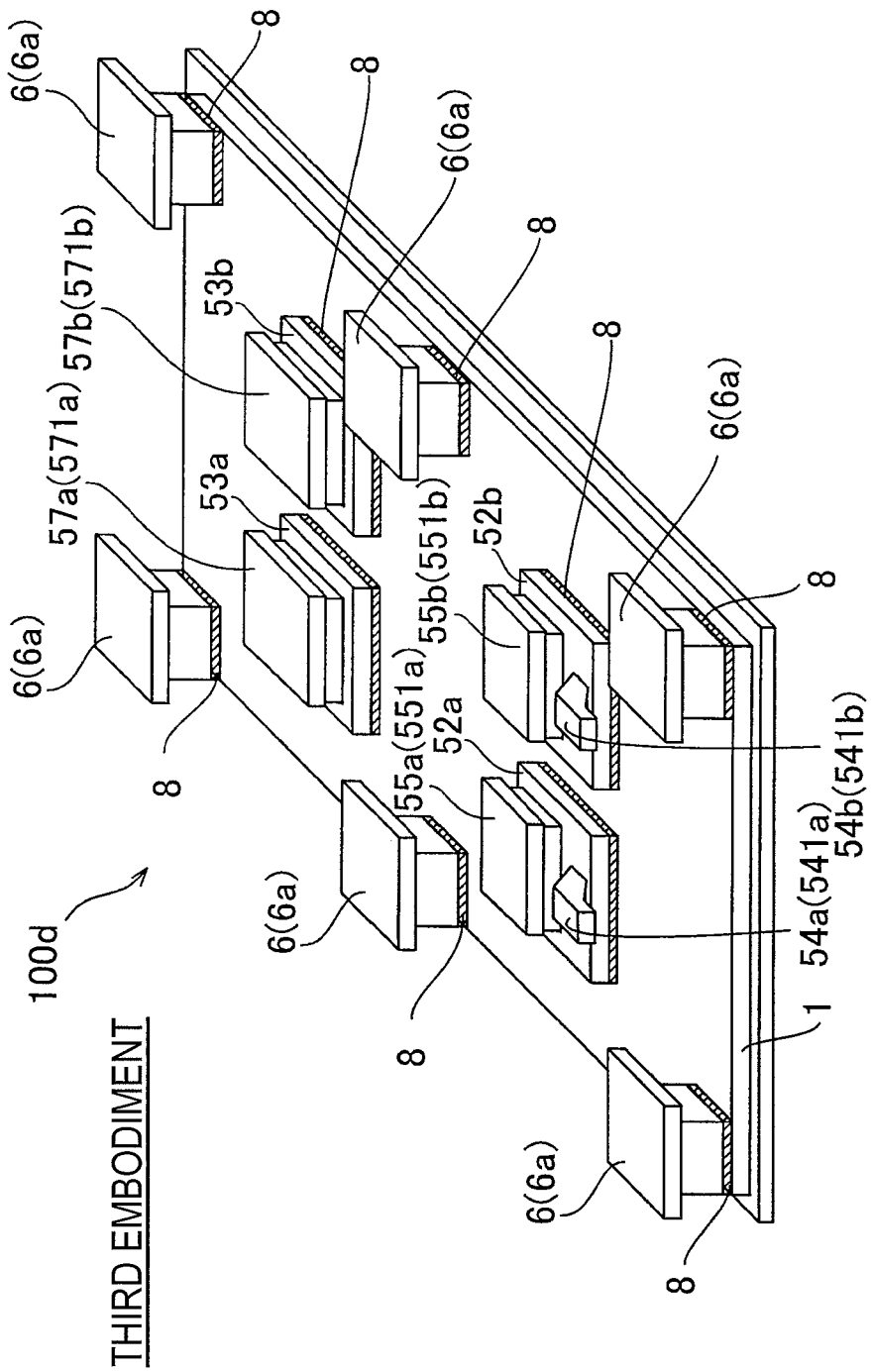
FIG. 12 is a perspective view as viewed from the surface side of a power module main unit in a state in which no resin material is formed indicating a third embodiment.

As illustrated in FIG. 12, with a power module main unit 100d, two semiconductor devices 52a and 52b, and two semiconductor devices 53a and 53b are joined onto the surface of the drain and cathode electrode heat sink 1 via the joining material 8 made up of solder. The semiconductor devices 52a and 52b are FETs (field-effect transistors) of silicon carbide (SiC) which can perform higher temperature operation than a Si-based semiconductor. The semiconductor devices 53a and 53b are made up of a first recovery diode (FRD) which serves as a reflux diode of silicon carbide (SiC) which can perform higher temperature operation than a Si-based semiconductor. The drain electrodes of the semiconductor devices 52a and 52b are electrically connected to the drain and cathode electrode heat sink 1 (drain and cathode terminal 6) (see FIG. 14). The cathode electrodes of the semiconductor devices 53a and 53b are electrically connected to the drain and cathode electrode heat sink 1 (drain and cathode terminal 6) (see FIG. 14). Gate terminals 54a and 54b are connected to the upper surfaces of the semiconductor devices 52a and 52b respectively. Source terminals 55a and 55b are connected to the surfaces of the semiconductor devices 52a and 52b respectively. Anode terminals 57a and 57b are connected to the surfaces of the semiconductor devices 53a and 53b respectively. The semiconductor device 52a (52b) is an example of "power conversion semiconductor device" and "voltage driving transistor element". The semiconductor device 53a (53b) is an example of "power conversion semiconductor device" and "reflux diode element".

Figure 13:
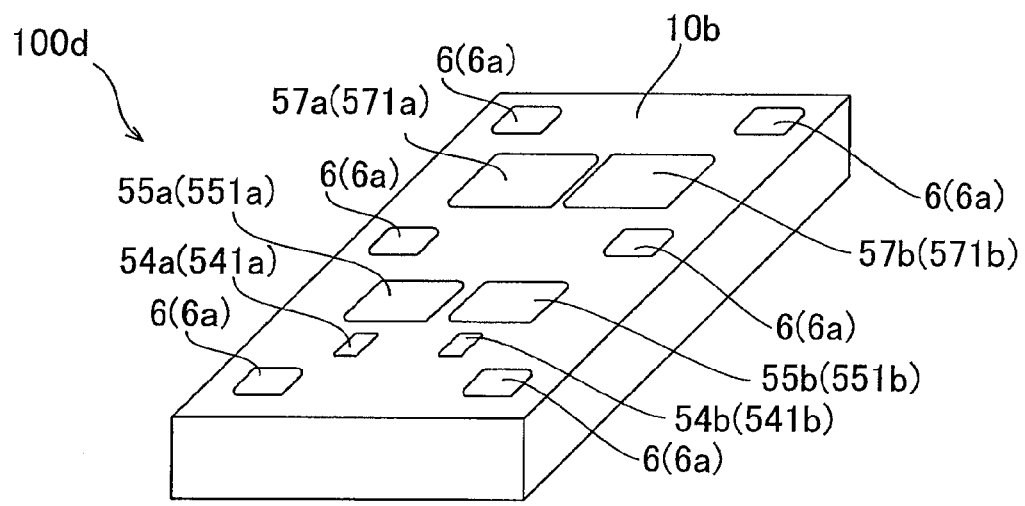
FIG. 13 is a perspective view as viewed from the surface side of the power module main unit indicating the third embodiment.
Figure 14:
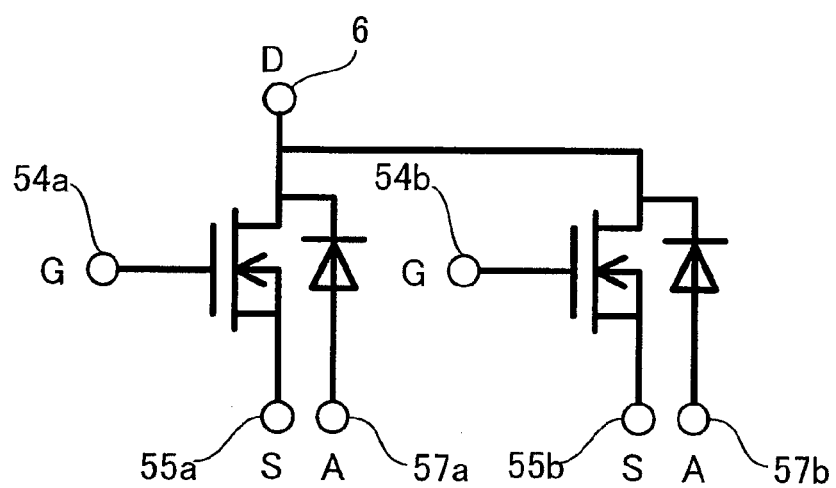
FIG. 14 is a circuit diagram of the power module main unit indicating the third embodiment.

In FIG. 13, with the power module main unit 100d, an insulating resin material 10b made up of silicon gel or the like is provided so as to cover the side faces of the semiconductor devices 52a and 52b, semiconductor devices 53a and 53b, gate terminals 54a and 54b, source terminals 55a and 55b, drain and cathode terminals 6, anode terminals 57a and 57b, and the drain and cathode electrode heat sink 1. In this way, the outer face of the power module main unit 100d is formed of the resin material 10b. The resin material 10b is an example of "sealing material".

In FIG. 13, with the power module main unit 100d, the upper surface 541a of the gate terminal 54a, the upper surface 541b of the gate terminal 54b, the upper surface 551a of the source terminal 55a, the upper surface 551b of the source terminal 55b, the upper surfaces 6a of the drain and cathode terminals 6, the upper surface 571a of the anode terminal 57a, and the upper surface 571b of the anode terminal 57b are formed so as to expose from the upper surface of the resin material 10b.

With the third embodiment, as described above, the two semiconductor devices 52a and 52b, and the two semiconductor devices 53a and 53b are provided to the power module main unit 100d. Thus, the parallel numbers of the semiconductor devices are increased, whereby a high current can be applied thereto.

The other advantages of the third embodiment are the same as with the first embodiment.

Fourth Embodiment

A fourth embodiment will be described with reference to FIGS. 15 through 17. With the fourth embodiment, the source terminals 55a and 55b of the two semiconductor devices 52a and 52b are electrically connected at a power module main unit 100e. Also, the anode terminals 57a and 57b of the two semiconductor devices 53a and 53b are electrically connected.

Figure 15:
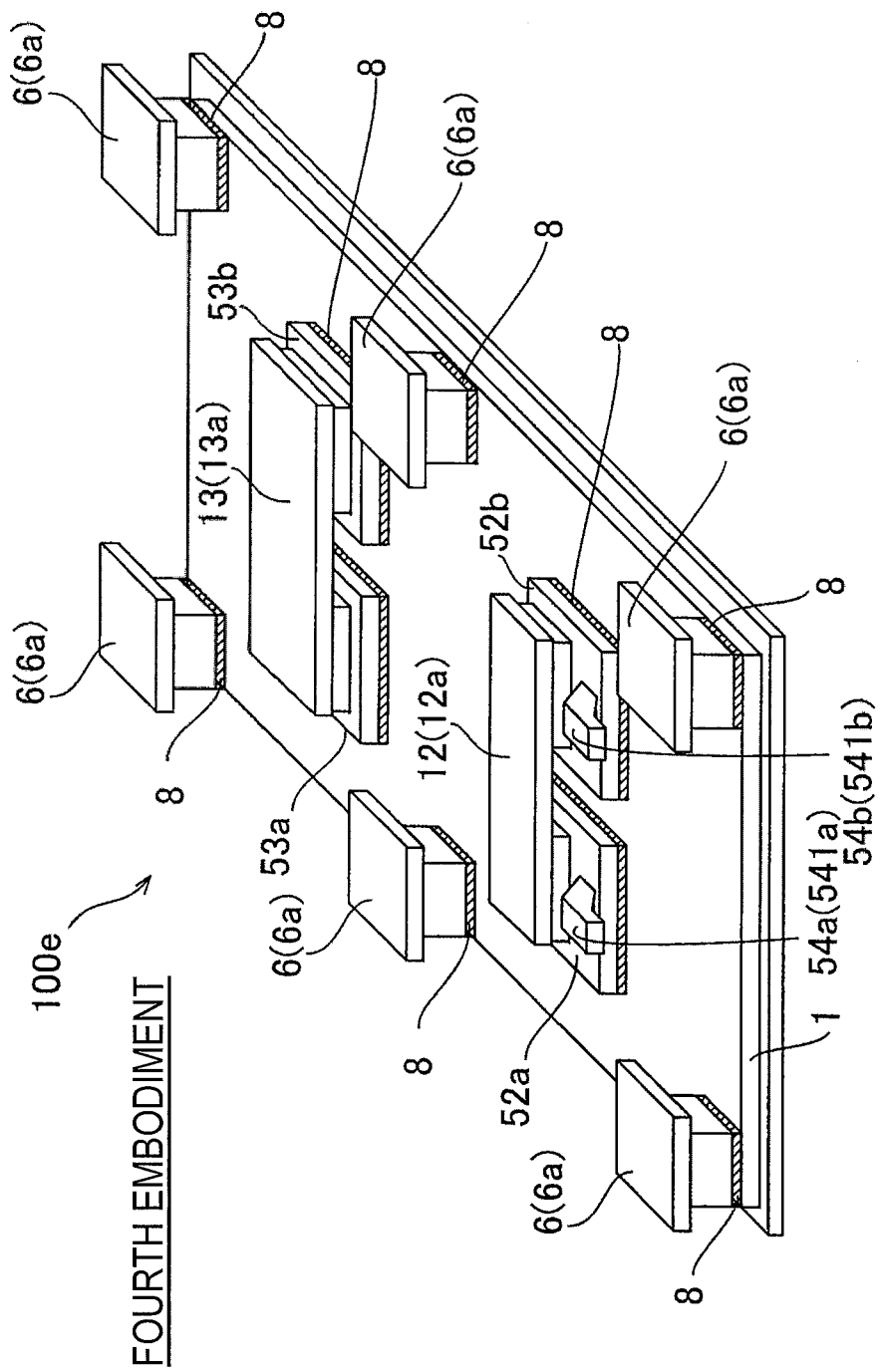
FIG. 15 is a perspective view as viewed from the surface side of a power module main unit in a state in which no resin material is formed indicating a fourth embodiment.

As illustrated in FIG. 15, with the power module main unit 100e, the source terminals 55a and 55b of the two semiconductor devices 52a and 52b are connected by a connection metal plate 12 via the joining material 8 made up of solder. Thus, the two semiconductor devices 52a and 52b are connected in parallel (see FIG. 17). Also, the anode terminals 57a and 57b of the two semiconductor devices 53a and 53b are connected by a connection metal plate 13 via the joining material 8 made up of solder. Thus, the two semiconductor devices 53a and 53b are connected in parallel (see FIG. 17).

Figure 16:
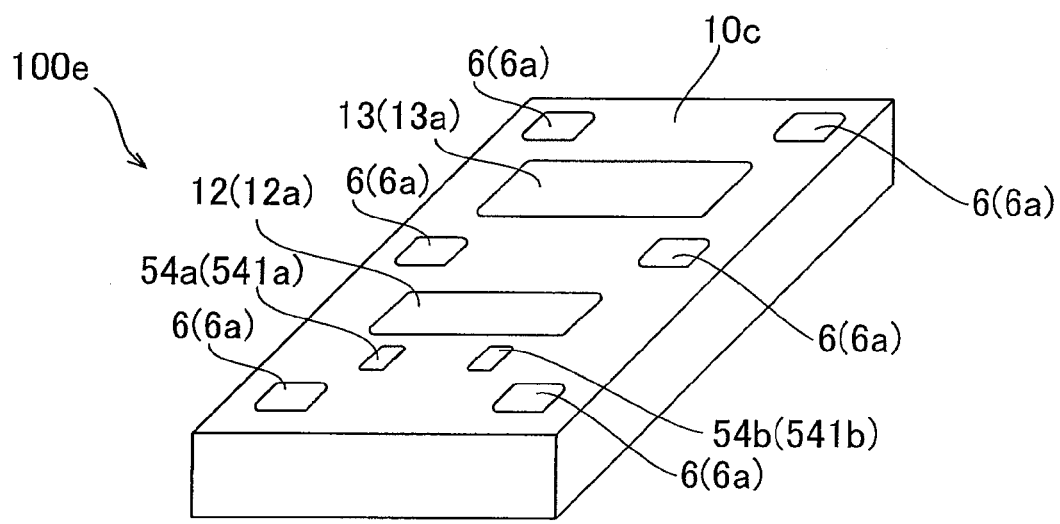
FIG. 16 is a perspective view as viewed from the surface side of the power module main unit indicating the fourth embodiment.
Figure 17:
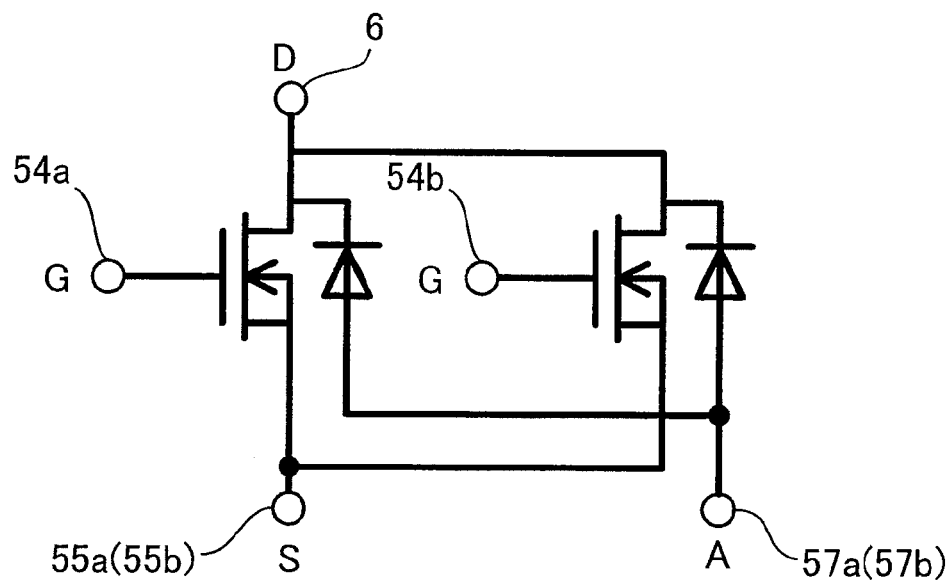
FIG. 17 is a circuit diagram of the power module main unit indicating the fourth embodiment.

As illustrated in FIG. 16, the upper surface 541a of the gate terminal 54a, the upper surface 541b of the gate terminal 54b, the upper surface 12a of the connection metal plate 12, the upper surface 13a of the connection metal plate 13, and the upper surfaces 6a of the drain and cathode terminals 6 are formed so as to expose from the upper surface of a resin material 10c. The resin material 10c is an example of "sealing material".

With the fourth embodiment, as described above, the source terminals 55a and 55b of the two semiconductor devices 52a and 52b are connected by the connection metal plate 12. The anode terminals 57a and 57b of the two semiconductor devices 53a and 53b are connected by the connection metal plate 13. Thus, as compared to the above second embodiment, difference in the areas of the metal portion on the lower face side (drain and cathode electrode heat sink 1) and the metal portion on the upper surface side (the upper surface 4a of the gate terminal 4, the upper surface 12a of the connection metal plate 12, the upper surface 13a of the connection metal plate 13, and the upper surfaces 6a of the drain and cathode terminals 6) of the power module main unit 100e is further reduced. As a result thereof, strain (difference in dimension) caused due to thermal expansion of the metal portions between the lower face side and upper surface side of the power module main unit 100e is reduced. Thus, stress concentration serving as a generation factor of a crack can be eased at the joined portions of the power module main unit 100e. As a result thereof, the longer life and higher reliability of the power module main unit 100e can be realized. Also, the source terminals 55a and 55b (anode terminals 57a and 57b) are connected by the connection metal plate 12 (13). Thus, a radiation area from the upper surface can be increased as compared to a case where the source terminals 55a and 55b (anode terminals 57a and 57b) are not connected by the connection metal plate 12 (13), and accordingly, radiant quantity can be increased.

The other advantages of the fourth embodiment are the same as with the above second and third embodiments.

Fifth Embodiment

A fifth embodiment will be described with reference to FIGS. 18 through 20. With a power module main unit 100f according to the present fifth embodiment, the source terminal 55a of the semiconductor device 52a, the source terminal 55b of the semiconductor device 52b, the anode terminal 57a of the semiconductor device 53a, and the anode terminal 57b of the semiconductor device 53b are electrically connected.

Figure 18:
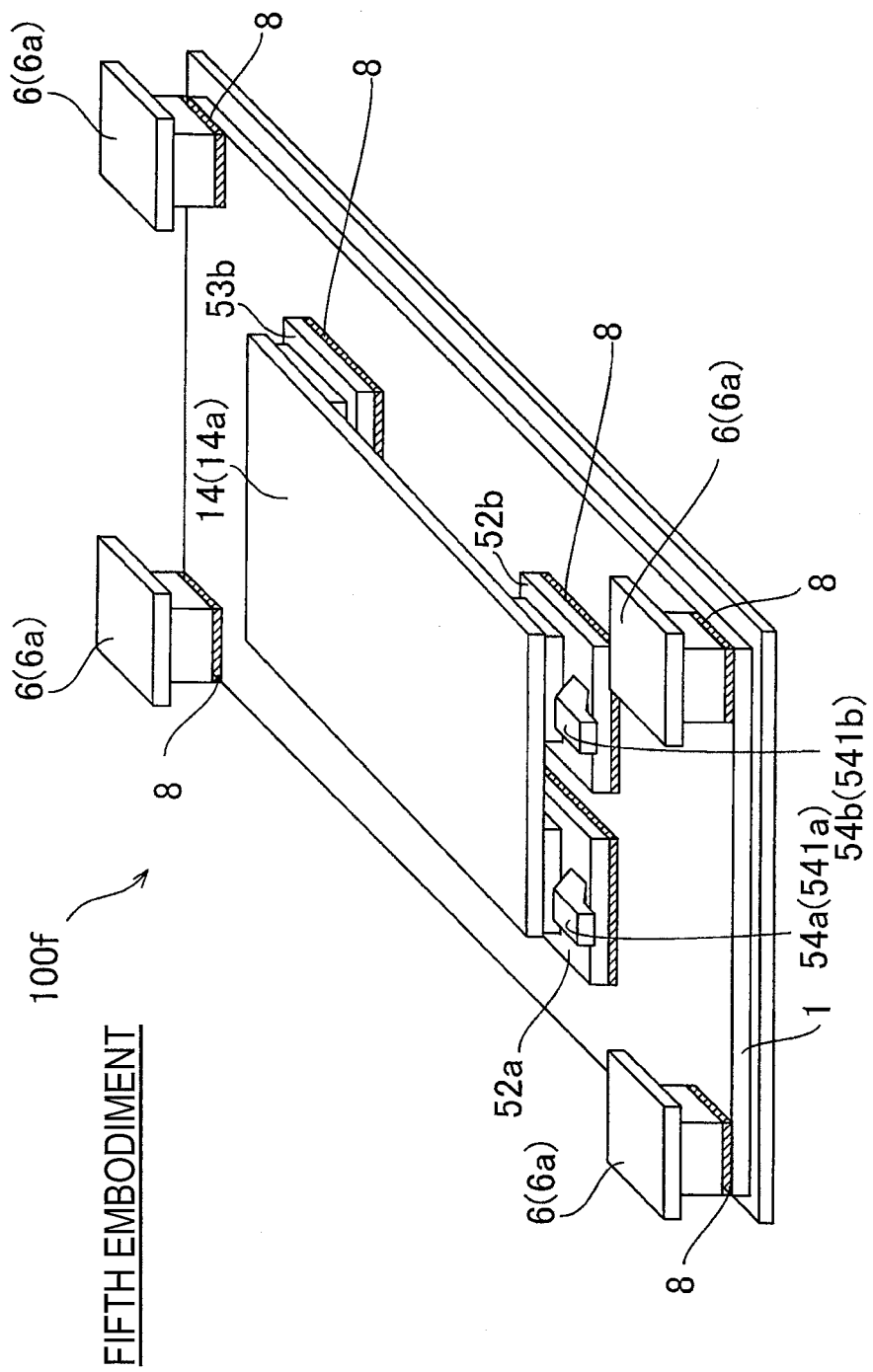
FIG. 18 is a perspective view as viewed from the surface side of a power module main unit in a state in which no resin material is formed indicating a fifth embodiment.

In FIG. 18, with the power module main unit 100f, the source terminal 55a of the semiconductor device 52a, the source terminal 55b of the semiconductor device 52b, the anode terminal 57a of the semiconductor device 53a, and the anode terminal 57b of the semiconductor device 53b are connected by a connection metal plate 14 via the joining material 8 made up of solder. Thus, the four semiconductor devices 53a, 53b, 52a, and 52b are connected in parallel (see FIG. 20).

Figure 19:
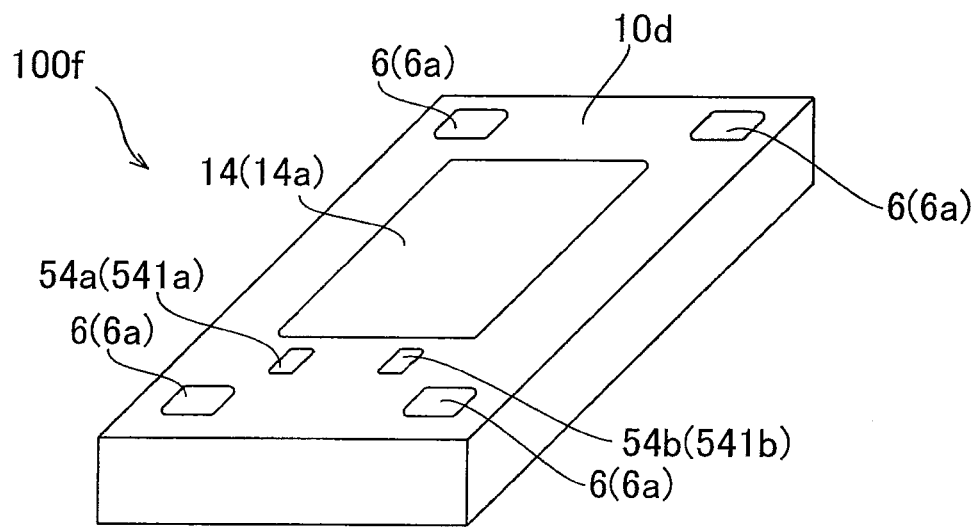
FIG. 19 is a perspective view as viewed from the surface side of the power module main unit indicating the fifth embodiment.
Figure 20:
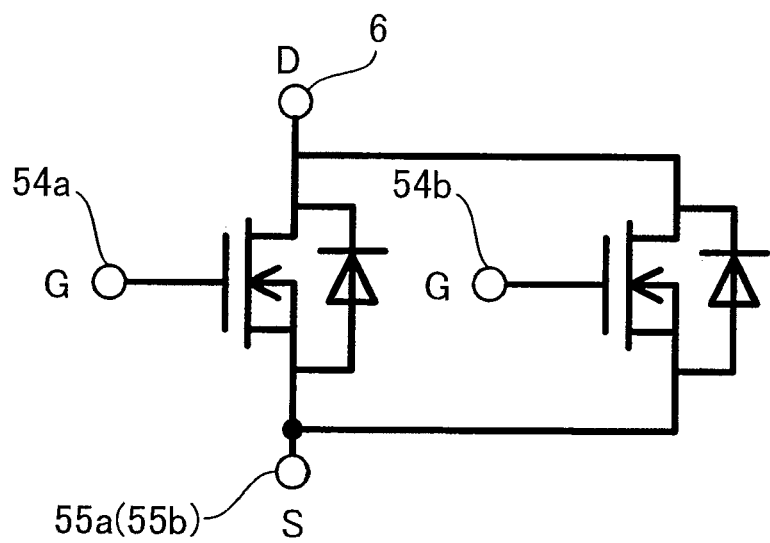
FIG. 20 is a circuit diagram of the power module main unit indicating the fifth embodiment.

As illustrated in FIG. 19, the upper surface 541a of the gate terminal 54a, the upper surface 541b of the gate terminal 54b, the upper surface 14a of the connection metal plate 14, and the upper surfaces 6a of the drain and cathode terminals 6 are formed so as to expose from the upper surface of a resin material 10d. The resin material 10d is an example of "sealing material".

With the fifth embodiment, as described above, the source terminal 55a of the semiconductor device 52a, the source terminal 55b of the semiconductor device 52b, the anode terminal 57a of the semiconductor device 53a, and the anode terminal 57b of the semiconductor device 53b are connected by a connection metal plate 14. Thus, as compared to the above fourth embodiment, difference in the areas of the metal portion on the lower face side (drain and cathode electrode heat sink 1) and the metal portion on the upper surface side (the upper surface 4a of the gate terminal 4, the upper surface 14a of the connection metal plate 14, and the upper surfaces 6a of the drain and cathode terminals 6) of the power module main unit 100f is further reduced. As a result thereof, strain (difference in dimension) caused due to thermal expansion of the metal portions between the lower face side and upper surface side of the power module main unit 100f can further be reduced. Thus, stress concentration serving as a generation factor of a crack can maximally be eased at the joined portions of the power module main unit 100f. As a result thereof, the longer life and higher reliability of the power module main unit 100f can further be realized. Also, the source terminal 55a, source terminal 55b, anode terminal 57a, and anode terminal 57b are connected by the connection metal plate 14. Thus, a radiation area from the upper surface can be increased as compared to a case where the source terminal 55a, source terminal 55b, anode terminal 57a, and anode terminal 57b are not connected by the connection metal plate 14, and accordingly, radiant quantity can be increased.

The other advantages of the fifth embodiment are the same as with the above second and third embodiments.

Sixth Embodiment

A sixth embodiment will be described with reference to FIGS. 21 through 23. With a power module main unit 100g according to the present sixth embodiment, a drain and cathode terminal 61 is formed in a case shape (frame shape) in contrast to the above first through fifth embodiments where the drain and cathode terminals 6 are formed in a pillar shape.

Figure 21:
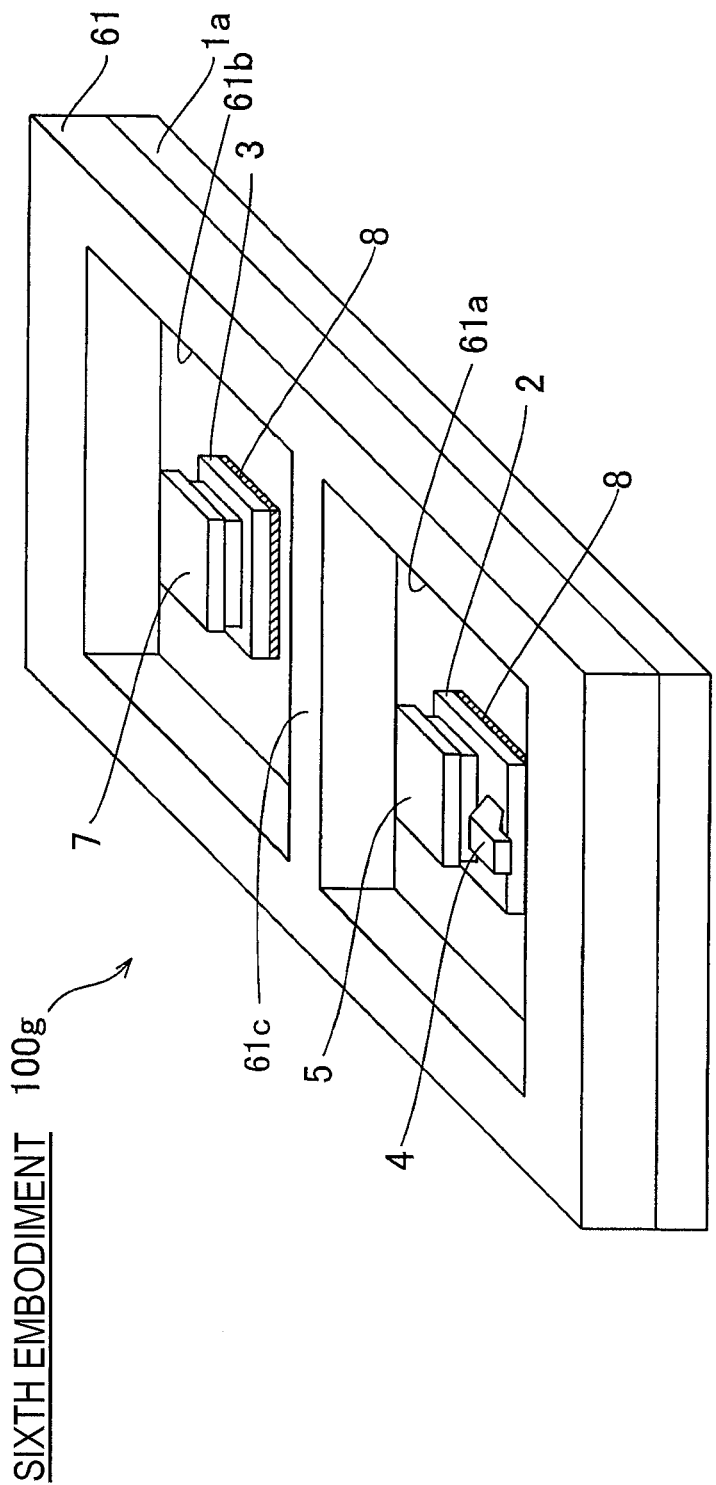
FIG. 21 is a perspective view as viewed from the surface side of a power module main unit in a state in which no resin material is formed indicating a sixth embodiment.

In FIG. 21, with a power module main unit 100g, the semiconductor device 2 and semiconductor device 3 are joined onto the surface of a drain and cathode electrode heat sink 1a via the joining material 8 made up of solder. The gate terminal 4 and source terminal 5 are joined onto the surface of the semiconductor device 2 via the joining material 8. The anode terminal 7 is joined onto the surface of the semiconductor device 3 via the joining material 8. The drain and cathode electrode heat sink 1a is an example of "second electrode conductor" and "second metal plate".

With the power module main unit 100g according to the sixth embodiment, a case-shaped (frame-shaped) drain and cathode terminal 61 is joined onto the surface of the drain and cathode electrode heat sink 1a by the joining material 8 or a reduction method so as to surround each of the semiconductor devices 2 and 3. The reduction method mentioned here is a method wherein the drain and cathode terminal 61 made up of, for example, copper (Cu), and the drain and cathode electrode heat sink 1a are heated, and oxygen is then dissociated (reduced) from copper oxide to be formed on the surfaces of the drain and cathode terminal 61 and the drain and cathode electrode heat sink 1a, following which the drain and cathode terminal 61 and the drain and cathode electrode heat sink 1a are joined. Also, two openings 61a and 61b are provided to the drain and cathode terminal 61. A partition wall 61c is provided between the openings 61a and 61b. The semiconductor device 2 is disposed within the opening 61a. The semiconductor device 3 is disposed within the opening 61b. The drain electrode of the semiconductor device 2, the cathode electrode of the semiconductor device 3, and the drain and cathode terminal 61 have the same potential (see FIG. 23). The drain and cathode terminal 61 is an example of "electrode connection conductor", "second connection conductor", and "casing".

Figure 22:
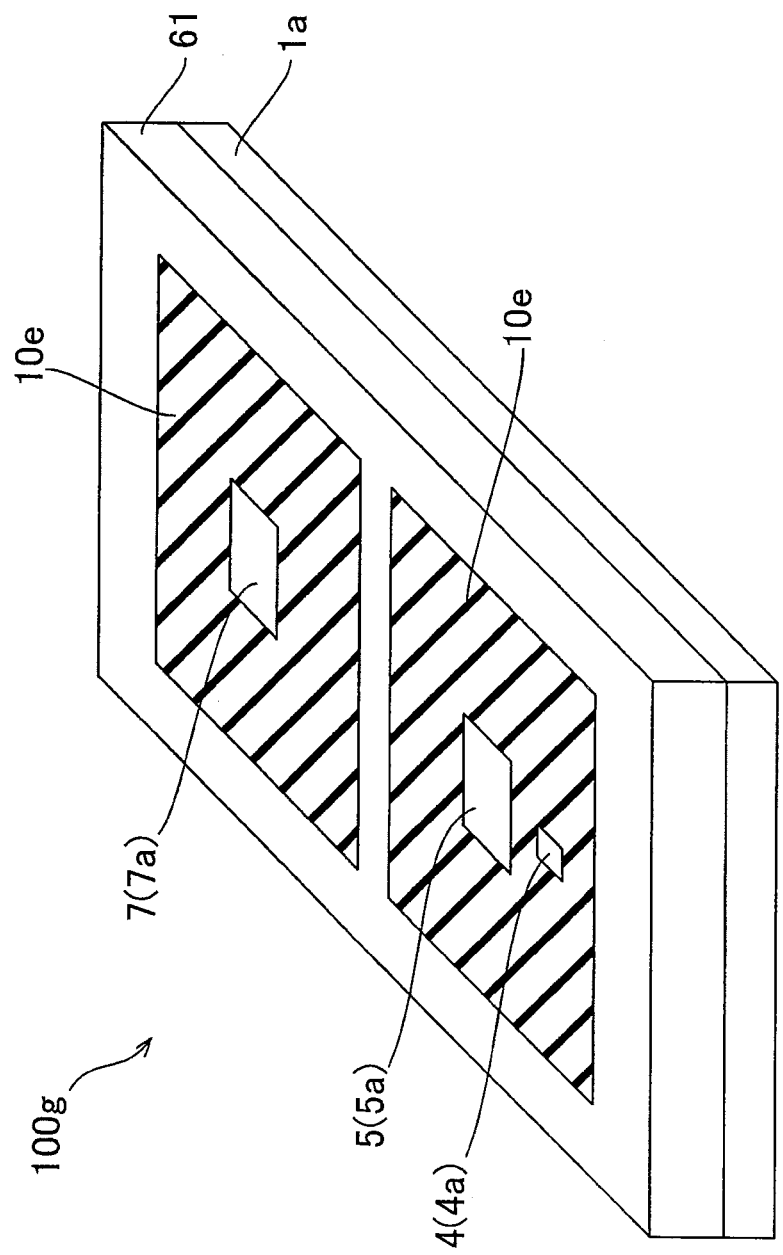
FIG. 22 is a perspective view as viewed from the surface side of the power module main unit indicating the sixth embodiment.
Figure 23:
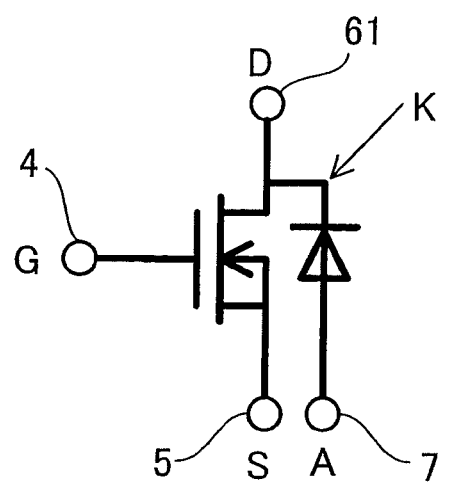
FIG. 23 is a circuit diagram of the power module main unit indicating the sixth embodiment.

As illustrated in FIG. 22, an insulating resin material 10e made up of silicon gel or the like is filled into the openings 61a and 61b of the drain and cathode terminal 61. The upper surface 4a of the gate terminal 4, the upper surface 5a of the source terminal 5, and the upper surface 7a of the anode terminal 7 are formed so as to expose from the upper surface of the resin material 10e. The resin material 10e is an example of "sealing material".

With the sixth embodiment, as described above, the case-shaped (frame-shaped) drain and cathode terminal 61 joined onto the surface of the drain and cathode electrode heat sink 1a is provided so as to surround each of the semiconductor devices 2 and 3. Thus, heat generated from the semiconductor devices 2 and 3 can be radiated more upwards for the worth of increase in the surface area as compared to a case where the drain and cathode terminal is formed in a pillar shape.

With the sixth embodiment, as described above, the resin material 10e is filled into the openings 61a and 61b of the drain and cathode terminal 61.

Seventh Embodiment

A seventh embodiment will be described with reference to FIGS. 24 through 26. With a power module main unit 100h according to the seventh embodiment, the upper surface 5a of the source terminal 5, and the upper surface 7a of the anode terminal 7 are electrically connected.

Figure 24:
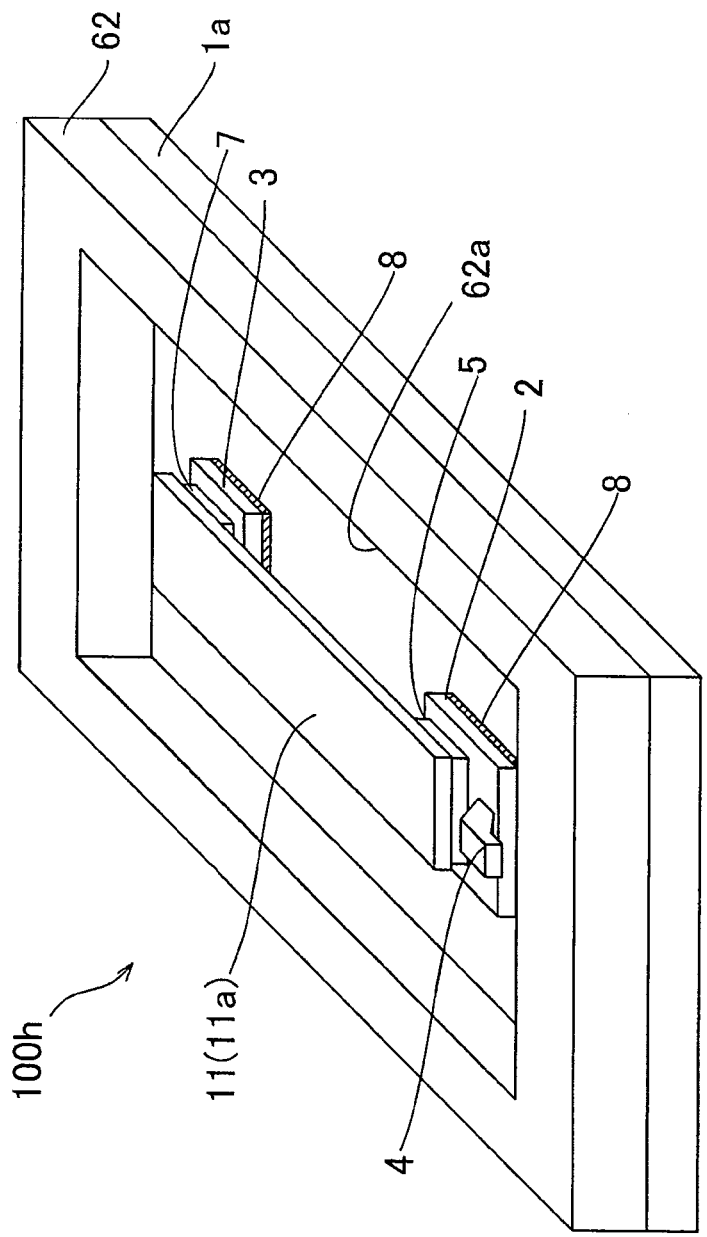
FIG. 24 is a perspective view as viewed from the surface side of a power module main unit in a state in which no resin material is formed indicating a seventh embodiment.

As illustrated in FIG. 24, with the power module main unit 100h, the upper surface 5a of the source terminal 5, and the upper surface 7a of the anode terminal 7 which have the same potential are connected by the connection metal plate 11. Thus, the source terminal 5 and anode terminal 7 are electrically connected (see FIG. 26). A case-shaped drain and cathode terminal 62 is joined onto the surface of the drain and cathode electrode heat sink 1a via the joining material 8 so as to surround each of the semiconductor devices 2 and 3. A single opening 62a is provided to the drain and cathode terminal 62. The semiconductor devices 2 and 3 are disposed within the single opening 62a. The drain and cathode terminal 62 is an example of "electrode connection conductor", "second connection conductor", and "casing".

Figure 25:
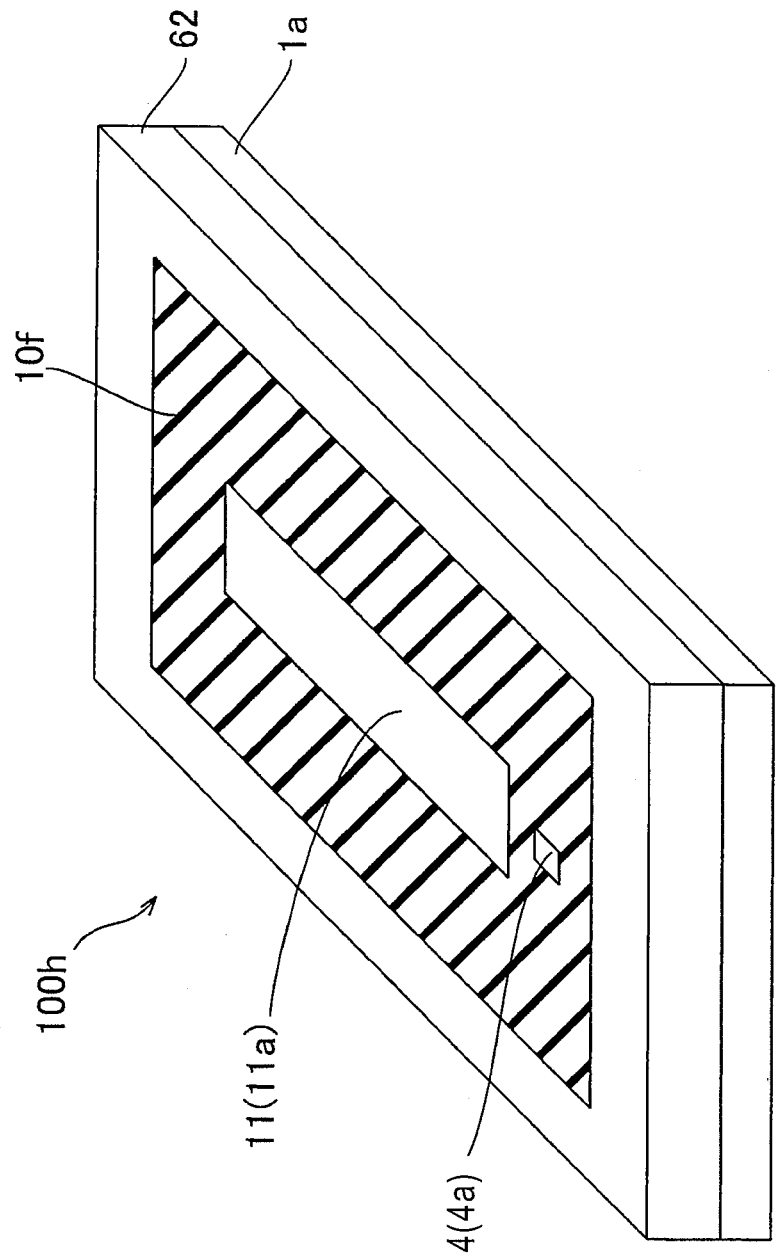
FIG. 25 is a perspective view as viewed from the surface side of the power module main unit indicating the seventh embodiment.
Figure 26:
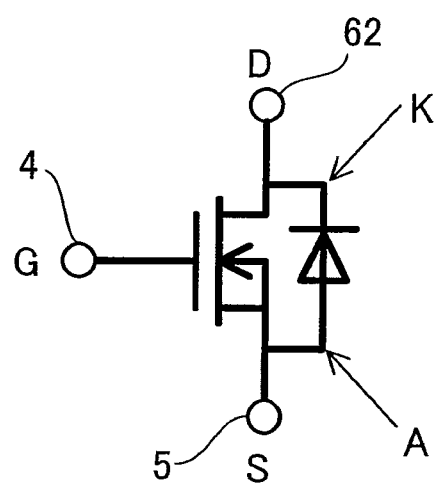
FIG. 26 is a circuit diagram of the power module main unit indicating the seventh embodiment.

As illustrated in FIG. 25, an insulating resin material 10f made up of silicon gel or the like is filled into the openings 62a of the drain and cathode terminal 62. The upper surface 4a of the gate terminal 4, and the upper surface 11a of the connection metal plate 11 are formed so as to expose from the upper surface of the resin material 10f. The resin material 10f is an example of "sealing material".

The advantages of the seventh embodiment are the same as with the above second and sixth embodiments.

Eighth Embodiment

Figure 28:
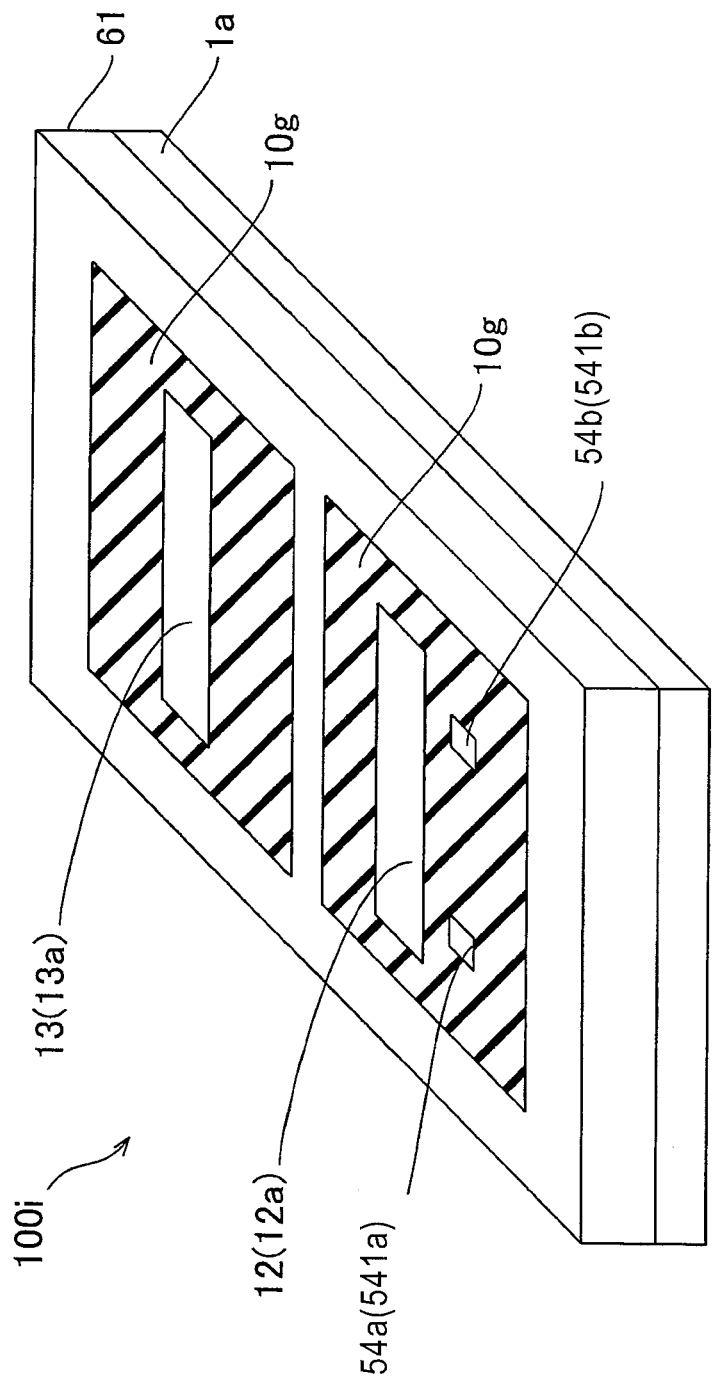
FIG. 28 is a perspective view as viewed from the surface side of the power module main unit indicating the eighth embodiment.
Figure 29:
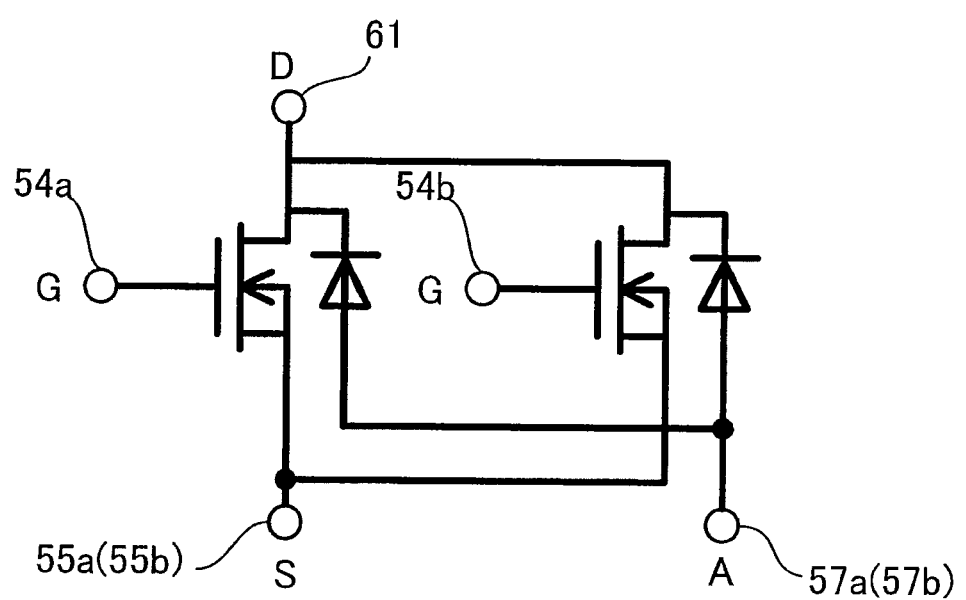
FIG. 29 is a circuit diagram of the power module main unit indicating the eighth embodiment.

An eighth embodiment will be described with reference to FIGS. 27 through 29. With a power module main unit 100i according to the present eighth embodiment, the case-shaped (frame-shaped) drain and cathode terminal 61 according to the above sixth embodiment is employed instead of the pillar-shaped drain and cathode terminal 6 according to the above fourth embodiment.

Figure 27:
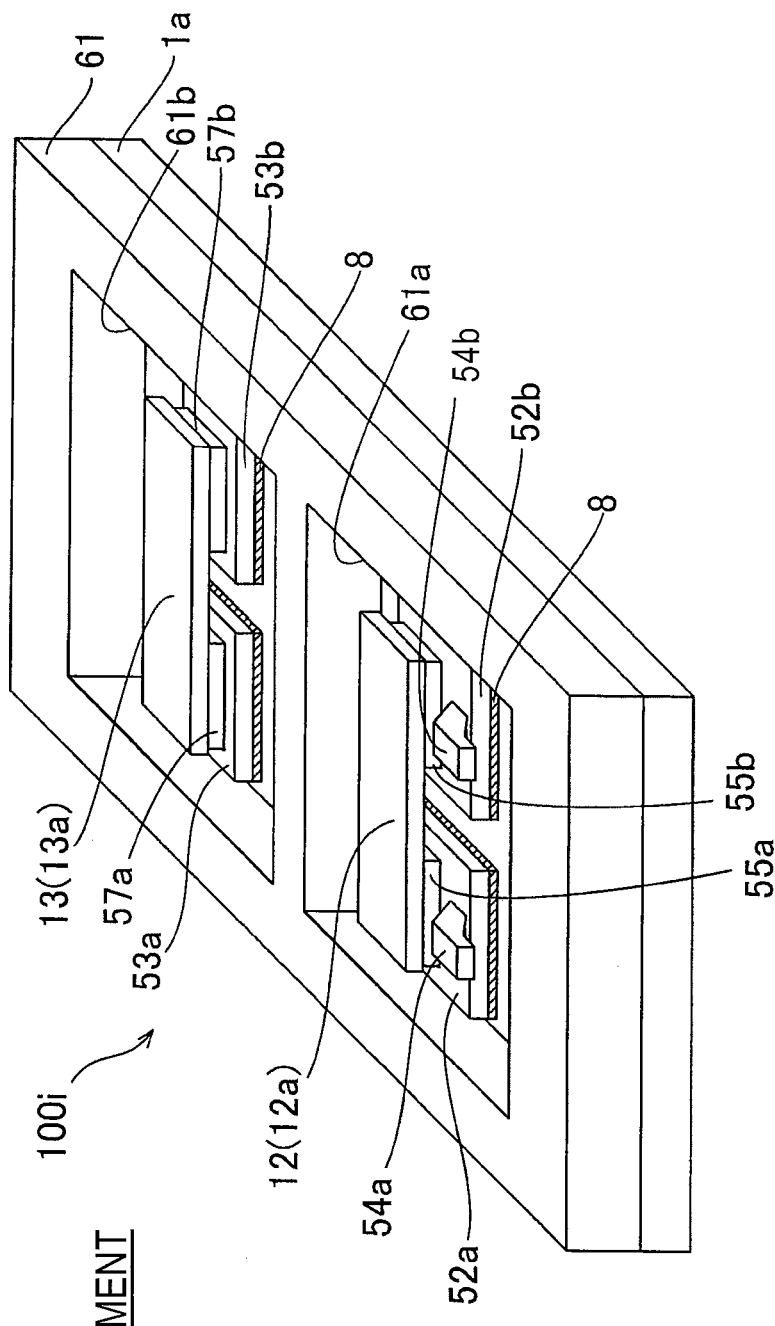
FIG. 27 is a perspective view as viewed from the surface side of a power module main unit in a state in which no resin material is formed indicating an eighth embodiment.

As illustrated in FIG. 27, with the power module main unit 100i, the source terminals 55a and 55b of two semiconductor devices 52a and 52b are connected by the connection metal plate 12. Thus, the two semiconductor devices 52a and 52b are connected in parallel (see FIG. 29). Also, the anode terminals 57a and 57b of two semiconductor devices 53a and 53b are connected by the connection metal plate 13. Thus, the two semiconductor devices 53a and 53b are connected in parallel (see FIG. 29).

The case-shaped drain and cathode terminal 61 is joined onto the surface of the drain and cathode electrode heat sink 1a via the joining material 8 so as to surround each of the semiconductor devices 2 and 3. As illustrated in FIG. 28, an insulating resin material 10g made up of silicon gel or the like is filled into the two openings 61 and 61b of the drain and cathode terminal 61a. The upper surface 541a of the gate terminal 54a, the upper surface 541b of the gate terminal 54b, the upper surface 12a of the connection metal plate 12, and the upper surface 13a of the connection metal plate 13 are provided so as to be exposed from the upper surface of the resin material 10g. The resin material 10g is an example of "sealing material".

The advantages of the eighth embodiment are the same as with the above fourth and sixth embodiments.

Ninth Embodiment

Figure 31:
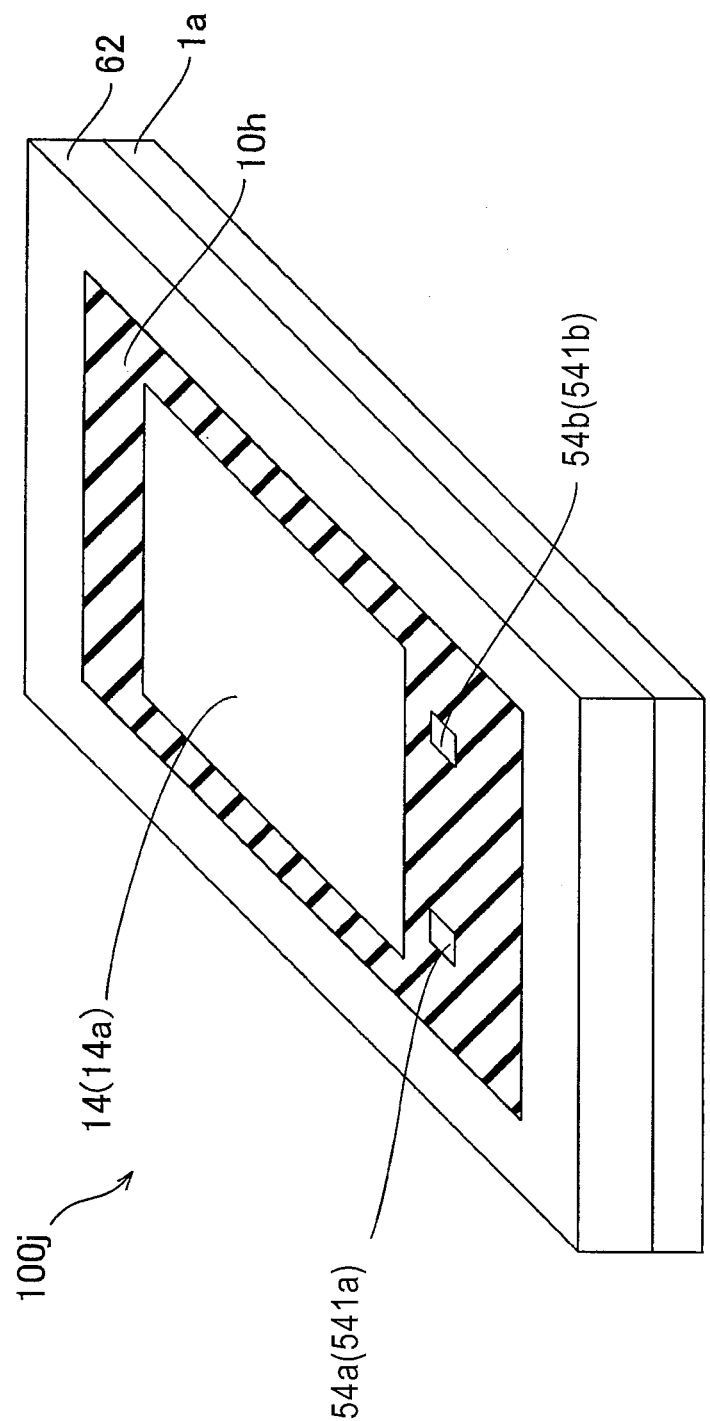
FIG. 31 is a perspective view as viewed from the surface side of the power module main unit indicating the ninth embodiment.
Figure 32:
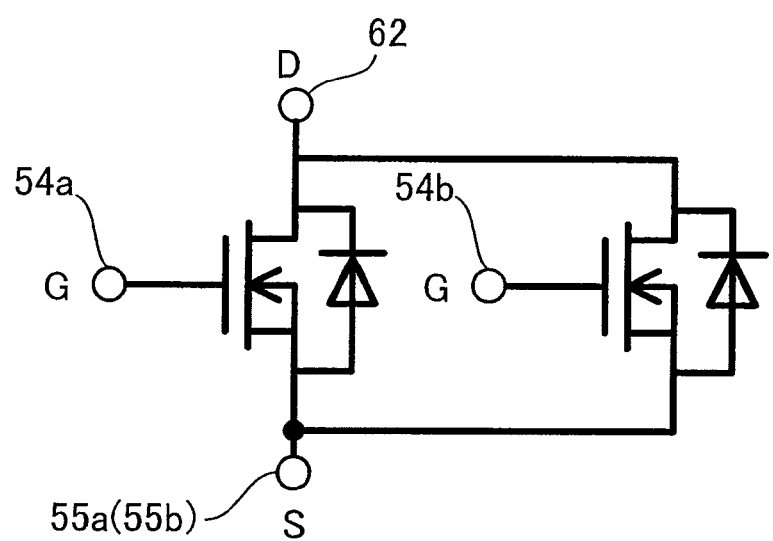
FIG. 32 is a circuit diagram of the power module main unit indicating the ninth embodiment.

A ninth embodiment will be described with reference to FIGS. 30 through 32. With a power module main unit 100j according to the present ninth embodiment, the case-shaped (frame-shaped) drain and cathode terminal 62 according to the above seventh embodiment is employed instead of the square-pole-shaped drain and cathode terminal 6 according to the above fifth embodiment.

Figure 30:
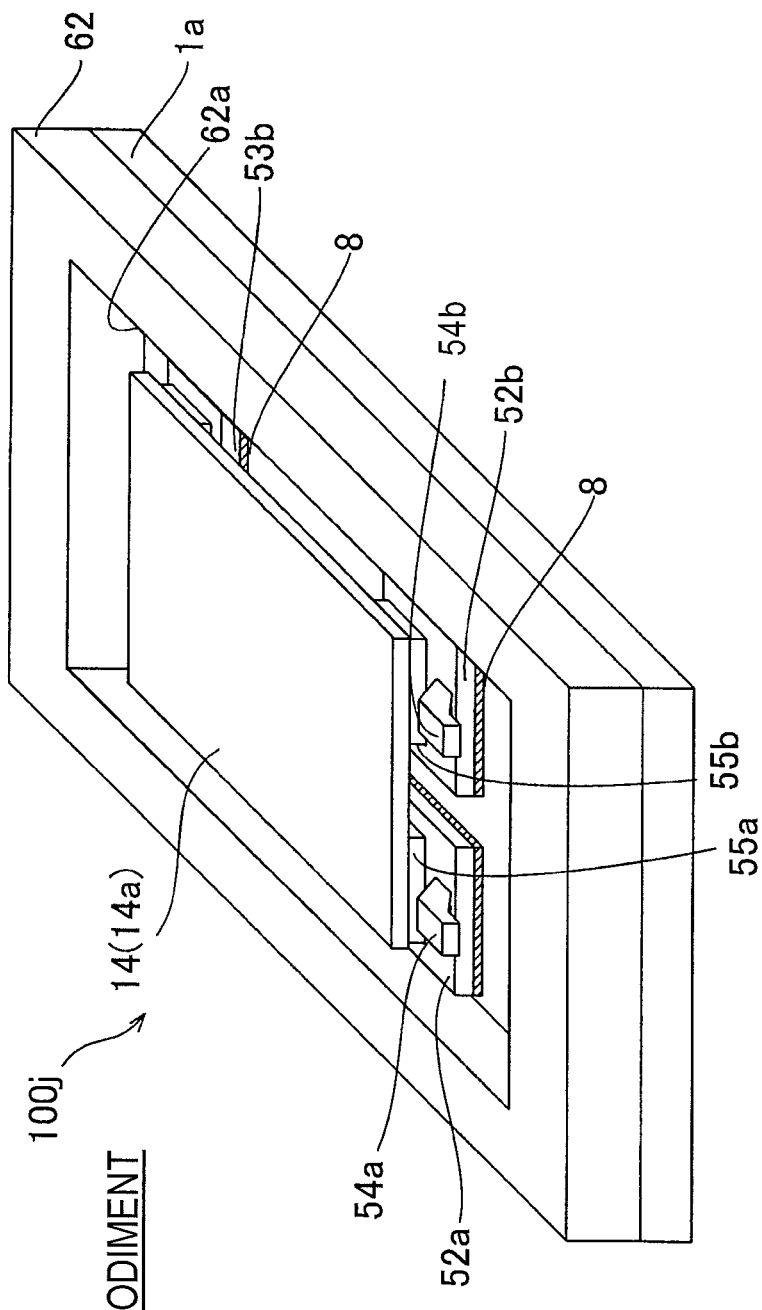
FIG. 30 is a perspective view as viewed from the surface side of a power module main unit in a state in which no resin material is formed indicating a ninth embodiment.

As illustrated in FIG. 30, with the power module main unit 100j, the source terminal 55a of the semiconductor device 52a, the source terminal 55b of the semiconductor device 52b, the anode terminal 57a of the semiconductor device 53a, the anode terminal 57b of the semiconductor device 53b are connected by the connection metal plate 14 via the joining material 8 made up of solder. Thus, the four of the semiconductor devices 52a and 52b, and the semiconductor devices 53a and 53b are connected in parallel (see FIG. 32). The case-shaped drain and cathode terminal 62 is joined onto the surface of the drain and cathode electrode heat sink 1a via the joining material 8 so as to surround each of the semiconductor devices 2 and 3.

An insulating resin material 10h made up of silicon gel or the like is filled into the opening 62a of the drain and cathode terminal 62. The upper surface 541a of the gate terminal 54a, the upper surface 541b of the gate terminal 54b, and the upper surface 14a of the connection metal plate 14 are formed so as to be exposed from the upper surface of the resin material 10h. The resin material 10h is an example of "sealing material".

The advantages of the ninth embodiment are the same as with the above fifth and seventh embodiments.

Tenth Embodiment

Figure 34:
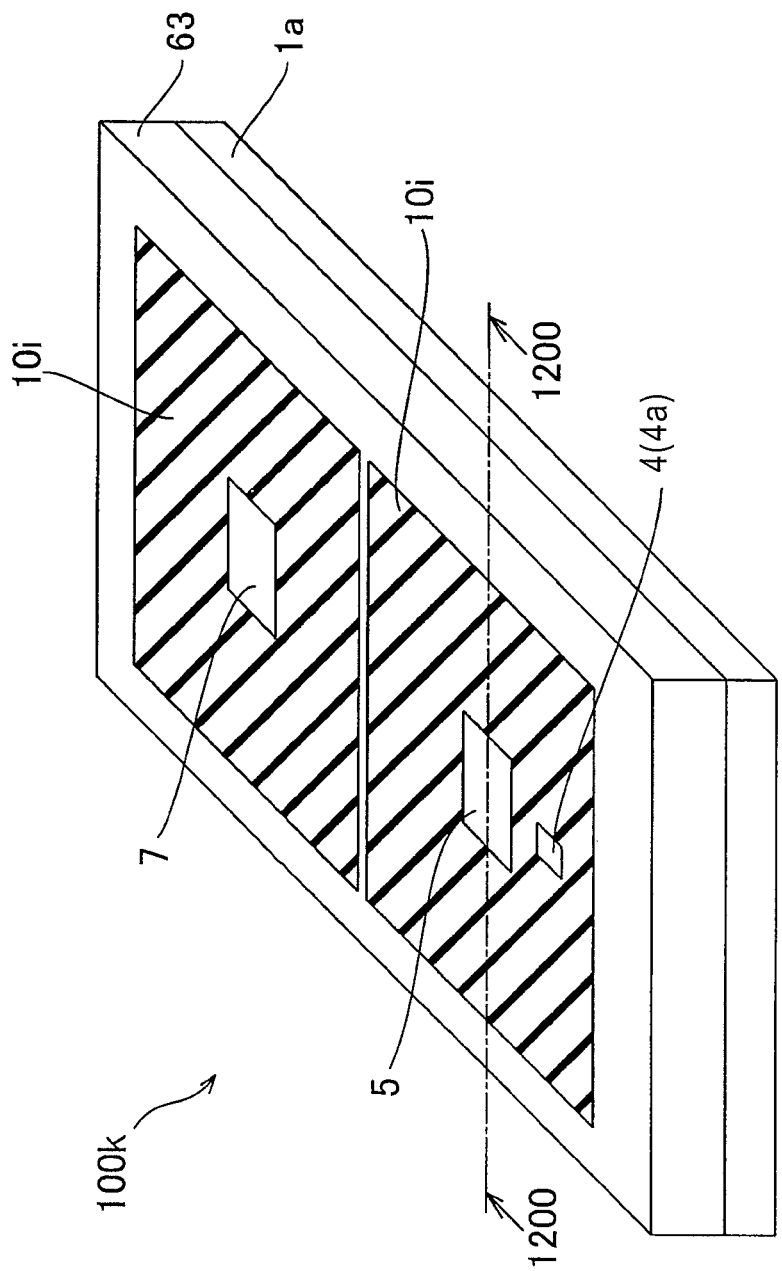
FIG. 34 is a perspective view as viewed from the surface side of the power module main unit indicating the tenth embodiment.
Figure 35:
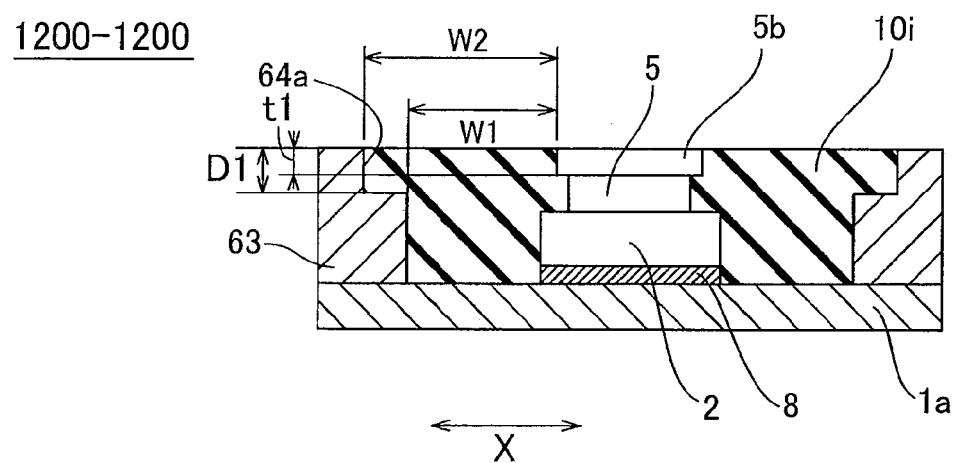
FIG. 35 is a cross-sectional view taken along 1200-1200 line in FIG. 34.

A tenth embodiment will be described with reference to FIGS. 33 through 35. With a power module main unit 100k according to the present tenth embodiment, steps 64a and 64b are provided to the drain and cathode terminal 61.

Figure 33:
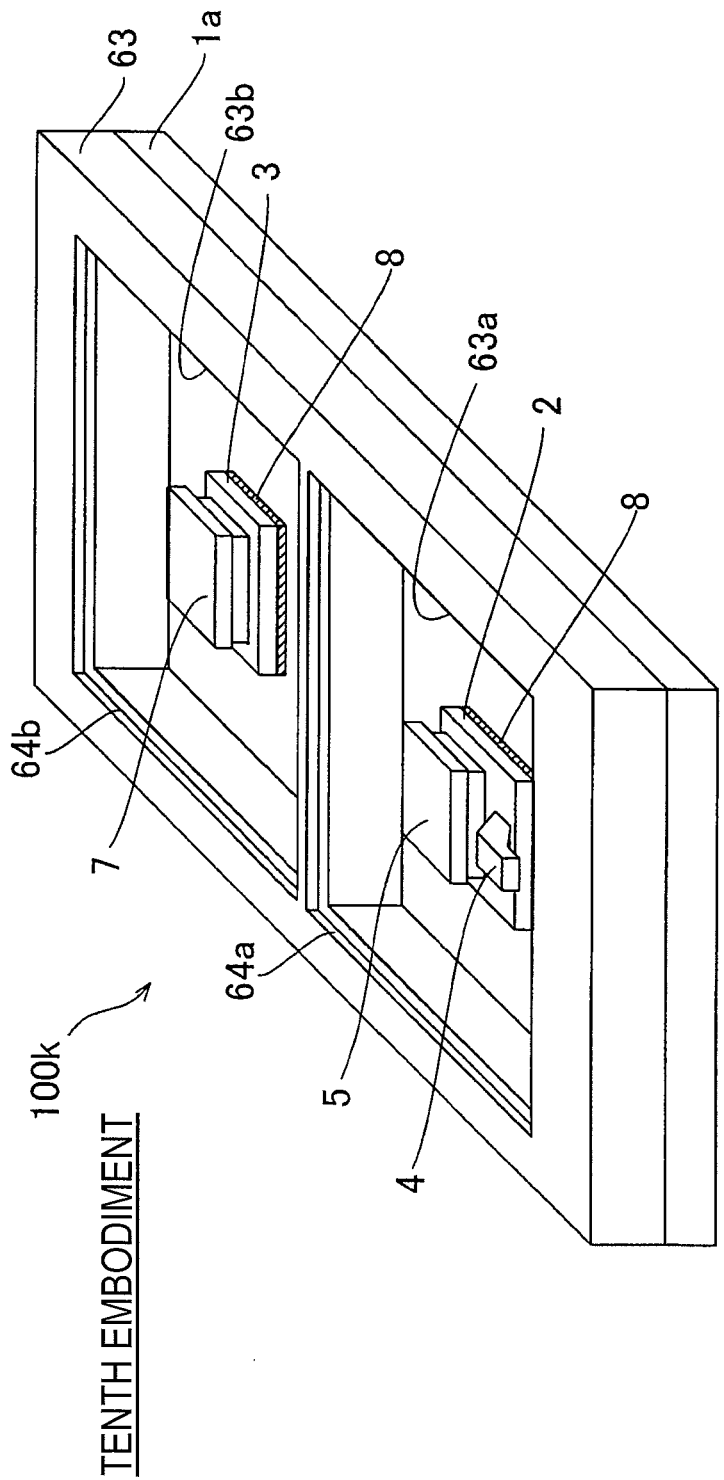
FIG. 33 is a perspective view as viewed from the surface side of a power module main unit in a state in which no resin material is formed indicating a tenth embodiment.

As illustrated in FIG. 33, with the power module main unit 100k, a case-shaped (frame-shaped) drain and cathode terminal 63 is joined onto the surface of the drain and cathode electrode heat sink 1a via the joining material 8 so as to surround each of the semiconductor devices 2 and 3. Openings 63a and 63b are provided to the drain and cathode terminal 63. The semiconductor device 2 is disposed within the opening 63a. The semiconductor device 3 is disposed within the opening 63b. The drain and cathode electrode heat sink 1a is an example of "electrode connection conductor" and "second connection conductor".

With the tenth embodiment, the circumferential steps 64a are formed in a portion facing the source terminal 5 (protrusion 5b) of the opening 63a of the drain and cathode terminal 63. As illustrated in FIG. 35, the depth D1 of the steps 64a is formed so as to be greater than the thickness t1 of the protrusion 5b of the upper portion of the source terminal 5 (D1>t1). Width W1 between the edge portion on the X direction side of the protrusion 5b, and the inner side on the X direction side of the drain and cathode terminal 63 is set so as to secure necessary insulation distance according to voltage used at the power module main unit 100k. Width W2 between the edge portion on the X direction side of the protrusion 5b, and the inner side face on the X direction side of the steps 64a is set in light of a degree of dimension whereby an insulating resin material 10i made up of silicon gel (see FIG. 34) can flow. The circumferential steps 64b are also similarly formed in a portion facing the source terminal 5 (protrusion 5b) of the opening 63b of the drain and cathode terminal 63. The source terminal 5 is an example of "upper surface side electrode conductor".

With the tenth embodiment, as described above, the steps 64a and 64b are provided to the portion facing the source terminal 5 of the drain and cathode terminal 63. Thus, the insulating resin material 10i made up of silicon gel or the like can flow while maintaining insulation distance between the source terminal 5 (anode terminal 7), and the drain and cathode terminal 63.

Note that the other advantages of the tenth embodiment are the same as with the above sixth embodiment.

Eleventh Embodiment

An eleventh embodiment will be described with reference to FIGS. 36 through 38. A power module main unit 100l according to the present eleventh embodiment differs from the first embodiment wherein the power module main unit is attached to the wiring substrate via the metal terminal formed in a pin shape (pillar shape). The power module main unit 1001 is attached to a wiring substrate 21a via an elastic deformable connection electrode 71.

Figure 36:
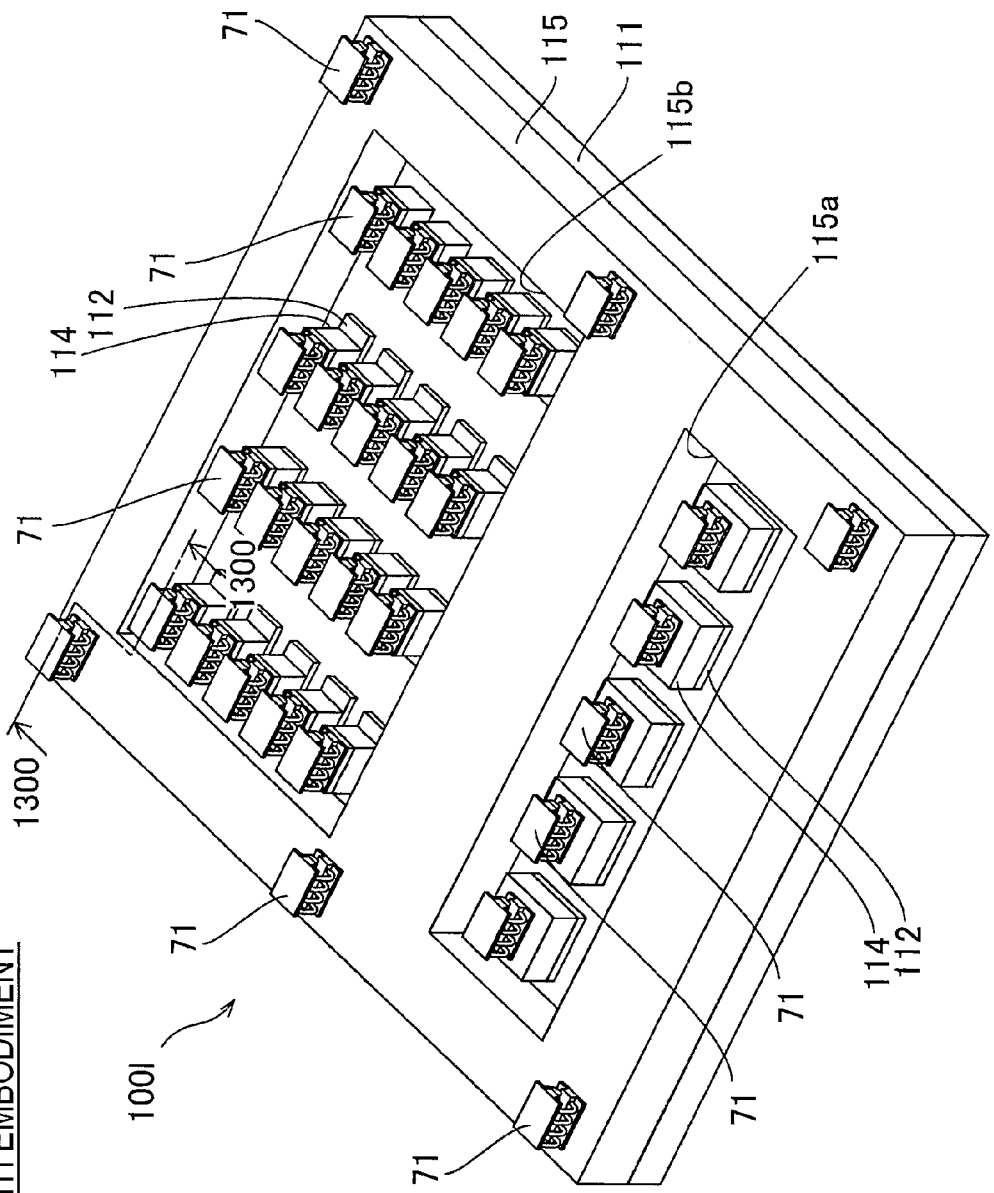
FIG. 36 is a perspective view as viewed from the surface side of a power module main unit in a state in which no resin material is formed indicating an eleventh embodiment.
Figure 37:
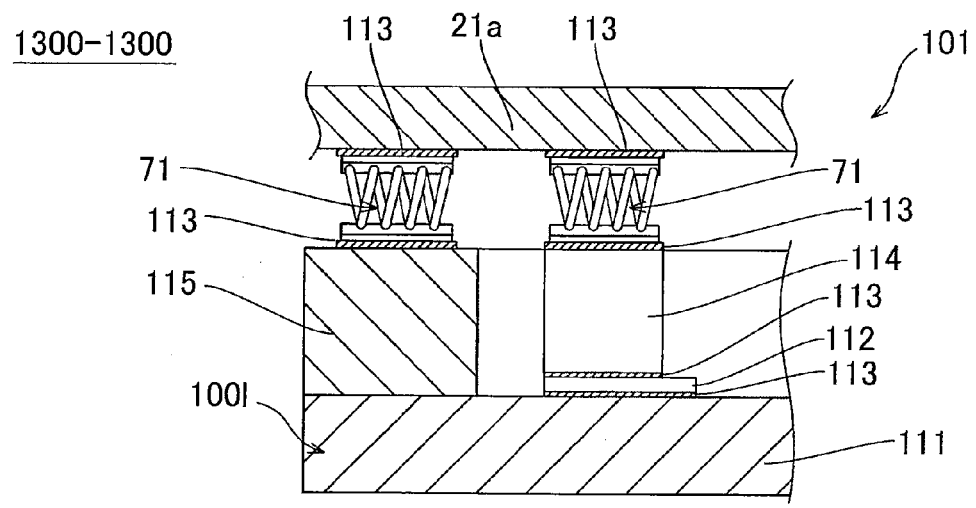
FIG. 37 is a cross-sectional view taken along 1300-1300 line in FIG. 36.

As illustrated in FIGS. 36 and 37, a power module 101 is configured of the power module main unit 1001, wiring substrate 21a, and connection electrode 71 which connects the wiring substrate 21a and power module main unit 1001. The connection electrode 71 is an example of "connection member".

With the power module main unit 1001, multiple semiconductor devices 112 are joined onto the surface of a drain and cathode electrode heat sink 111 made up of a metal plate via a joining material 113. The drain and cathode electrode heat sink 111 is an example of "second electrode conductor" and "second metal plate". The drain and cathode electrode heat sink 111 is configured so as to connect the electrodes of the rear face of the multiple semiconductor devices 112 having the same potential. The semiconductor devices 112 include an FET (field-effect transistor) of silicon carbide which can operate at higher temperature than a Si-based semiconductor, and a first recovery diode (FRD) which serves as a reflux diode. The semiconductor devices 112 are an example of "power conversion semiconductor device", "power driving transistor element", and "reflux diode element".

A semiconductor terminal 114 having a generally flat upper surface is connected onto the surfaces of the semiconductor devices 112 via the joining material 113. The semiconductor terminal 114 serves as a gate terminal, a source terminal, an anode terminal, or the like. The semiconductor terminal 114 is an example of "electrode connection conductor", "first electrode conductor", "transistor electrode conductor", and "diode electrode conductor".

A case-shaped (frame-shaped) drain and cathode terminal 115 having a generally flat upper surface is joined onto the surface of the drain and cathode electrode heat sink 111. The drain and cathode terminal 115 serves as a drain terminal and a cathode terminal. Openings 115a and 115b are provided to the case-shaped drain and cathode terminal 115, and the multiple semiconductor devices 112 are disposed within the openings 115a and 115b. An insulating resin material made up of silicon gel or the like which is not illustrated is filled into the openings 115a and 115b. The drain and cathode terminal 115 is an example of "second connection conductor" and "casing".

As illustrated in FIG. 37, with the power module main unit 1001, the connection electrode 71 is joined onto the surface of the semiconductor terminal 114 via the joining material 113. Also, the connection electrode 71 is joined onto the surface of the case-shaped drain and cathode terminal 115 via the joining material 113. The wiring substrate 21a is joined onto the surface of the connection electrode 71 via the joining material 113.

Figure 38:
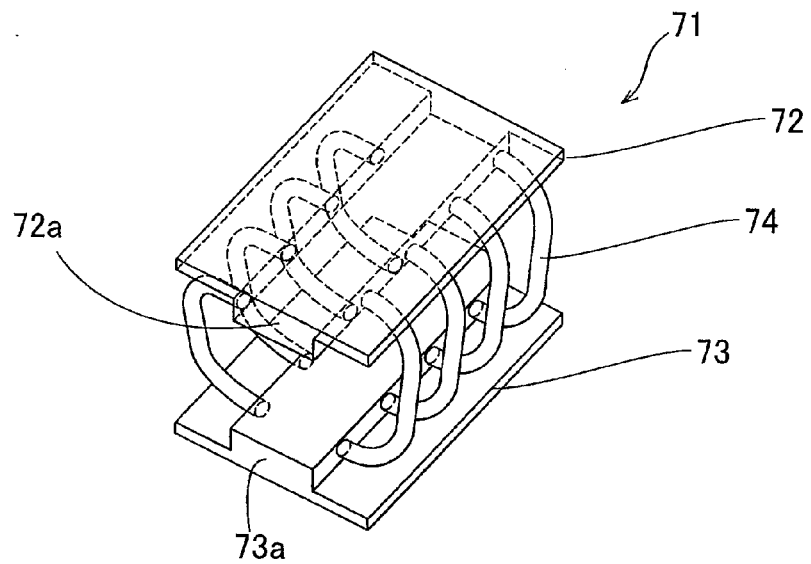
FIG. 38 is a perspective view of a connection electrode indicating the eleventh embodiment.

As illustrated in FIG. 38, the connection electrode 71 is configured of a metal plate 72, a metal plate 73, and a plurality of wire-shaped metal 74. The metal plate 72 and metal plate 73 have a protrusion 72a and a protrusion 73a, respectively. The metal plate 72 and metal plate 73 are disposed so that the protrusions 72a and 73a face to each other. The wire-shaped metal 74 has a generally elliptical shape, and is joined to the side faces of the protrusions 72a and 73a by hard soldering or the reduction method or the like. The wire-shaped metal 74 is formed of copper or aluminum or the like. The metal plates 72 and 73 are an example of "second connection metal plate" and "first connection metal plate", respectively.

With the eleventh embodiment, as described above, the generally flat upper surface of the semiconductor terminal 114 (drain and cathode terminal 115) is electrically connected to the wiring substrate 21a via the elastic deformable connection electrode 71. The thermal expansion coefficients of the wiring substrate 21a and the semiconductor terminal 114 (drain and cathode terminal 115) generally differ, and accordingly, stress is caused between the wiring substrate 21a and the semiconductor terminal 114 (drain and cathode terminal 115) due to mutual thermal expansion. Also, the wiring substrate 21a may cause inclination as to the power module main unit 1001 according to dimensional change due to thermal expansion. Therefore, the semiconductor terminal 114 (drain and cathode terminal 115) and the wiring substrate 21a are connected via the elastic deformable connection electrode 71, and accordingly, stress caused due to thermal expansion is absorbed by the elastic deformable connection electrode 71. As a result thereof, stress to be applied to the power module main unit 1001 can be reduced. Also, dimensional change caused in the vertical direction or torsional direction between the power module main unit 1001 and the wiring substrate 21a is absorbed by the elastic deformable connection electrode 71. According to such an operation, the reliability of the power module main unit 1001 can be improved.

With the eleventh embodiment, as described above, the connection electrode 71 includes an elastic deformable wire-shaped metal 74. Thus, the connection electrode 71 can readily elastically be deformed in the vertical direction or torsional direction.

Twelfth Embodiment

A twelfth embodiment will be described with reference to FIGS. 39 through 42. With a power module main unit 100m according to the present twelfth embodiment, wire-shaped metal 78 formed in a generally U-letter shape is joined to a pair of planar metal plates 76 and 77 in contrast to the eleventh embodiment wherein wire-shaped metal is connected to the protrusions of the above pair of metal plates.

Figure 39:
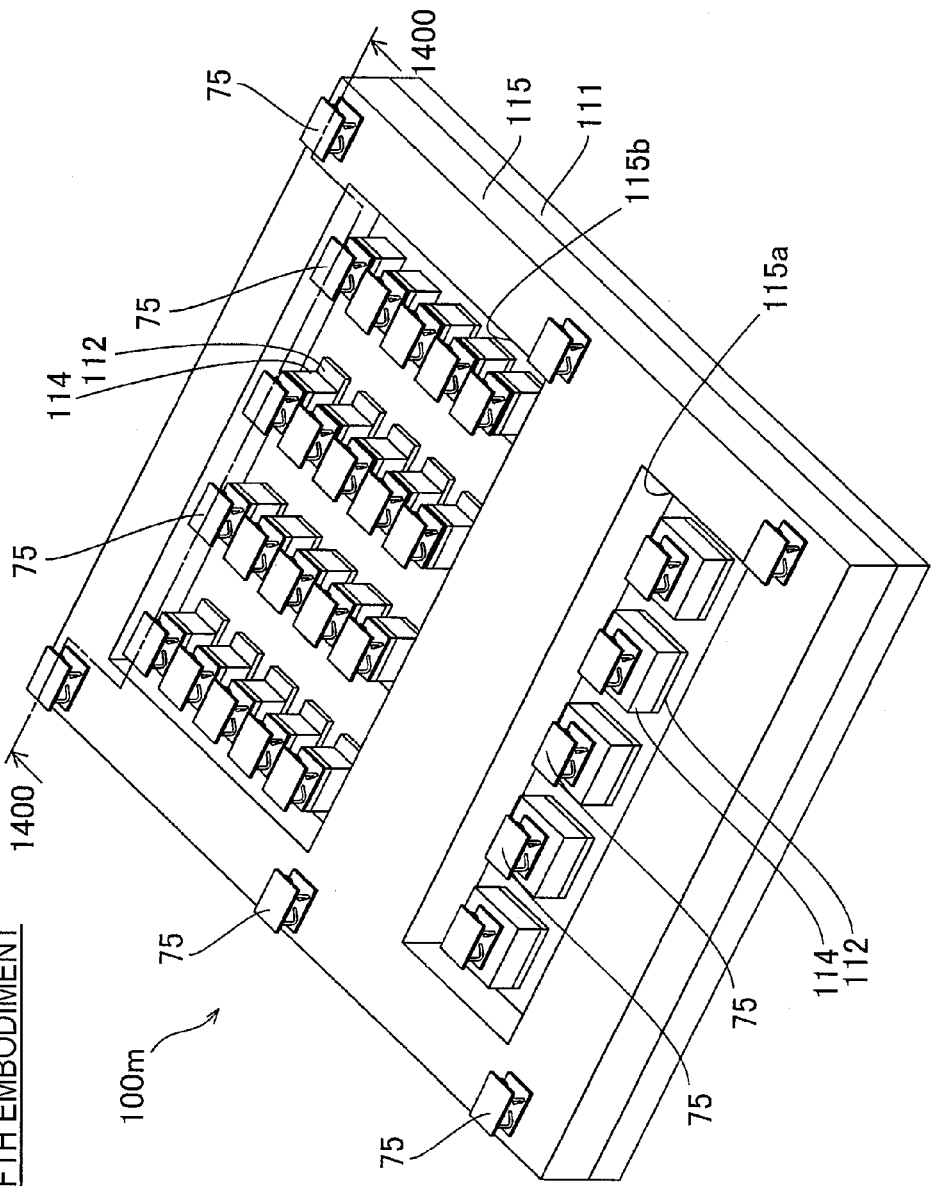
FIG. 39 is a perspective view as viewed from the surface side of a power module main unit in a state in which no resin material is formed indicating a twelfth embodiment.
Figure 40:
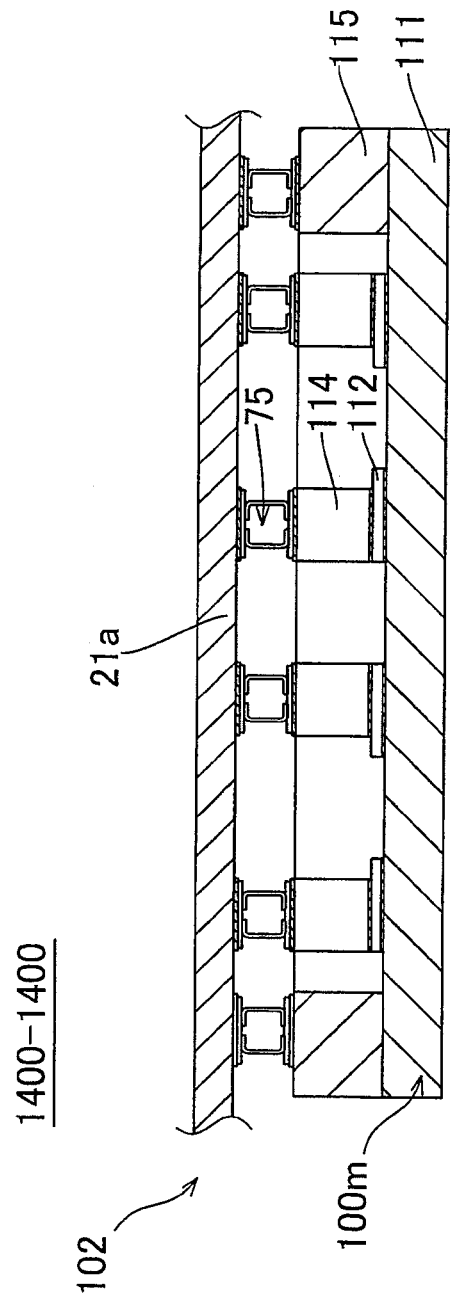
FIG. 40 is a cross-sectional view taken along 1400-1400 line in FIG. 39.
Figure 41:
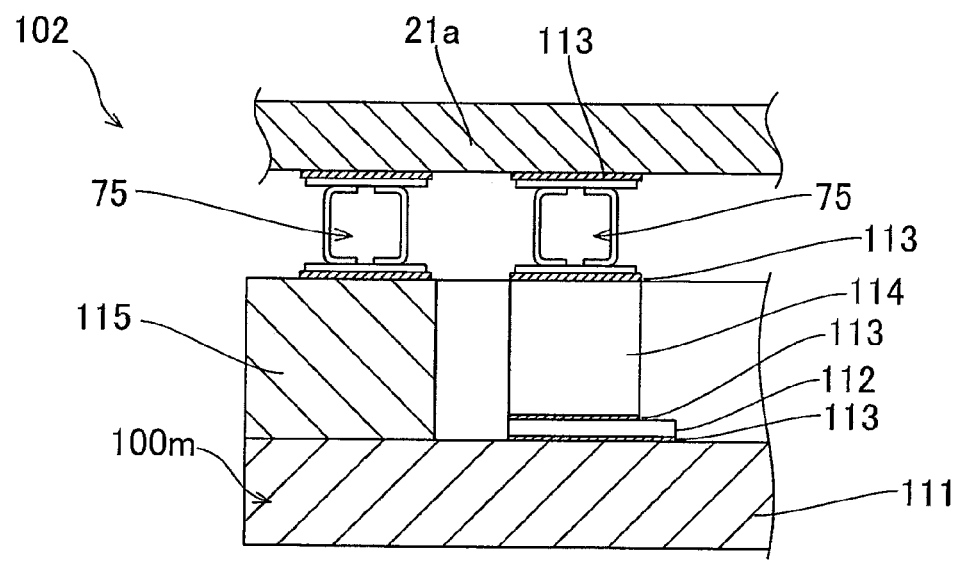
FIG. 41 is an enlarged cross-sectional view of FIG. 40.

As illustrated in FIGS. 39 through 41, a power module 102 is configured of the power module main unit 100m, the wiring substrate 21a, a connection electrode 75 which connects the power module main unit 100m and wiring substrate 21a. The connection electrode 75 is an example of "connection member".

The power module main unit 100m has a configuration wherein with the power module main unit 1001 according the above eleventh embodiment (see FIG. 36), the connection electrode 71 is replaced with the connection electrode 75. The other configurations of the power module main unit 100m are the same as with the power module main unit 1001 according to the above eleventh embodiment (see FIG. 36).

Figure 42:
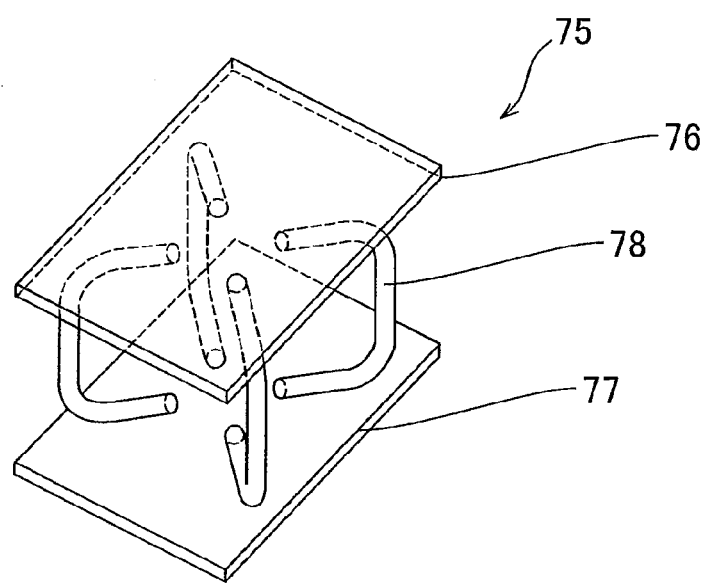
FIG. 42 is a perspective view of a connection electrode indicating the twelfth embodiment.

As illustrated in FIG. 42, the connection electrode 75 is configured of planar-shaped metal plates 76 and 77, and four wire-shaped metals 78. The wire-shaped metals 78 are formed in a generally U-letter shape. With the wire-shaped metals 78, both edge portion sides of the wire-shaped metals 78 are connected to the metal plates 76 and 77 respectively. The wire-shaped metals 78 are joined to the metal plates 76 and 77 by hard soldering or the reduction method or the like. The wire-shaped metals 78 are formed of copper or aluminum or the like. The metal plates 76 and 77 are an example of "second connection metal plate" and "first connection metal plate", respectively.

The advantages of the twelfth embodiment are the same as with the eleventh embodiment.

The embodiments disclosed this time can be conceived as not something restrictive but exemplifications in all points. The ranges of the present embodiments are indicated not with the description of the above embodiments but with the scope of Claims, and further, meanings equivalent to the scope of Claims, and all changes within the scope are included.

For example, with the above first through twelfth embodiments, there has been indicated an example employing an FET (field-effect transistor) of silicon carbide which can operate at higher temperature than an Si-based semiconductor, and a first recovery diode (FRD), as a semiconductor device, but the present disclosure is not restricted to these. For example, gallium nitride (GaN) may be employed as a semiconductor device. A MOSFET (metallic oxide film field-effect transistor) of silicon (Si) may be employed as a semiconductor device. An IGBT (Insulating Gate Bipolar Transistor) may be employed as a semiconductor device.

With the above first through twelfth embodiments, an example employing a first recovery diode (FRD) as a reflux diode has been indicated, but the present disclosure is not restricted to this. For example, a schottky barrier diode (SBD) may be employed as a semiconductor device. Further, another diode may be employed as long as this is a reflux diode.

With the above first through twelfth embodiments, an example has been indicated wherein the joining material is made up of Au-20Sn, Zn-30Sn, Pb-5Sn, organic layer-coated nano-Ag particles, or the like, but the present disclosure is not restricted to this. For example, solder foil or cream solder may be employed as the joining material.

With the above first through twelfth embodiments, an example has been indicated wherein the gate terminal, source terminal, drain terminal, and anode terminal have a pillar shape, but the present disclosure is not restricted to this. The gate terminal, source terminal, drain terminal, and anode terminal may have a shape other than a pillar shape.

With the above eleventh embodiment, an example has been illustrated wherein the power module main unit and wiring substrate are connected via the elastic deformable connection electrode, but the present disclosure is not restricted to this. For example, two wiring substrates may be connected via an elastic deformable connection electrode.

Figure 43:
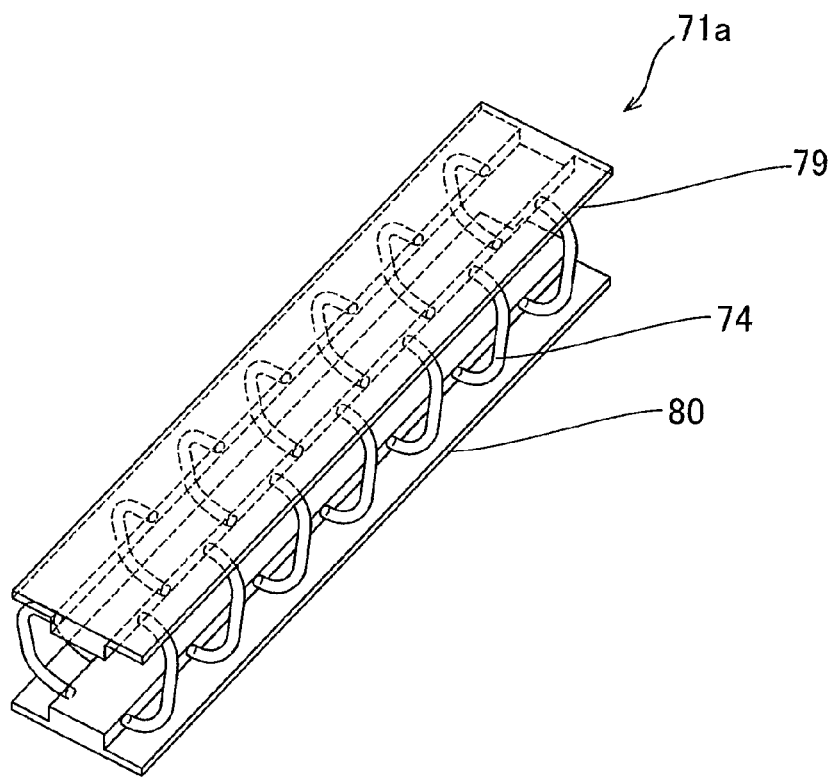
FIG. 43 is a perspective view of a connection electrode indicating a modification of the eleventh embodiment.

With the above eleventh embodiment, an example has been indicated wherein four wire-shaped metals 74 are disposed on a single side of the elastic deformable connection electrode 71 (see FIG. 38) at a time, but the present disclosure is not restricted to this. For example, an arrangement may be made wherein, as illustrated in FIG. 43, the length of the X direction of the metal plates 79 and 80 is increased, and seven wire-shaped metals 74 are disposed on a single side of an elastic deformable connection electrode 71a at a time. The metal plates 79 and 80 are an example of "second connection metal plate" and "first connection metal plate", respectively.

Figure 44:
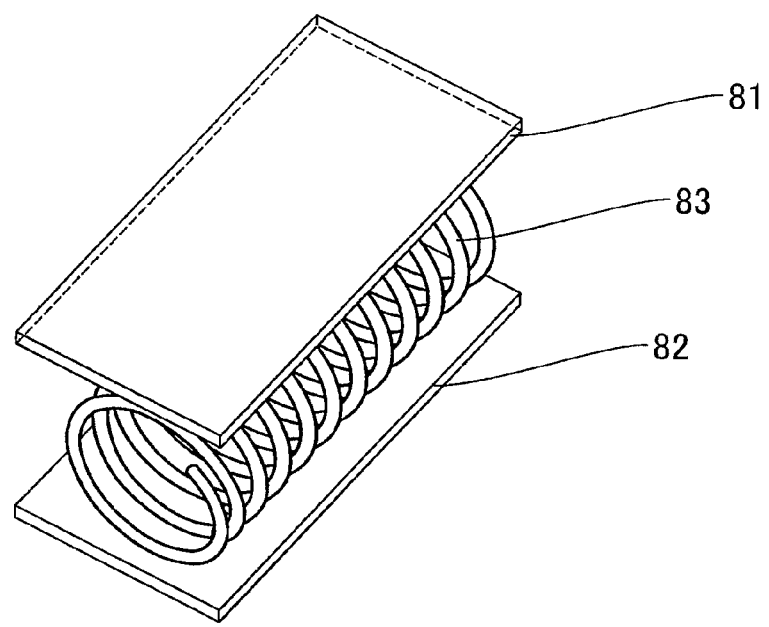
FIG. 44 is a perspective view of a connection electrode indicating a modification of the twelfth embodiment.

With the above twelfth embodiment, an example has been indicated wherein the wire-shaped metal 78 having a generally U-letter shape is employed, but the present disclosure is not restricted to this. For example, as illustrated in FIG. 44, wire-shaped metal 83 formed in a coil spring shape may be disposed between a pair of planar metal plates 81 and 82. The metal plates 81 and 82 are an example of "second connection metal plate" and "first connection metal plate" of the present embodiment, respectively.

Obviously, numerous modifications and variations of the present disclosure are possible in light of the above teachings. It is therefore to be understood that within the scope of the appended claims, the disclosure may be practiced otherwise than as specifically described herein.

What is claimed is:

1. A power converter comprising:
   a power converter main unit including
      a plurality of power conversion semiconductor devices having electrodes,
      an electrode connection conductor configured to electrically connect a plurality of said electrodes having the same potential, and also to have a generally flat upper surface for electrically connecting to an exterior device, and
      a sealing material made up of a resin which covers said power conversion semiconductor devices;
   wherein said generally flat upper surface of said electrode connection conductor is configured so as to expose from an upper surface of said sealing material; and
   wherein a wiring substrate is electrically connected to said generally flat upper surface of said electrode connection conductor which is exposed from the upper surface of said sealing material.

2. The power converter according to claim 1, wherein said electrode connection conductor is configured so as to electrically connect at least one of a plurality of said electrodes having the same potential which are disposed on upper surfaces of said plurality of power conversion semiconductor devices, or a plurality of said electrodes having the same potential which are disposed on lower surfaces of said plurality of power conversion semiconductor devices.

3. The power converter according to claim 2, said electrode connection conductor comprising:
   a plurality of first electrode conductors which are disposed on the upper surfaces of said plurality of power conversion semiconductor devices, electrically connected to a plurality of electrodes positioned on the upper surfaces of said plurality of power conversion semiconductor devices, extend upwards, and also have a generally flat upper surface; and
   a first connection conductor which is disposed on said generally flat upper surfaces of said first electrode conductors having the same potential so as to connect said generally flat upper surfaces of said first electrode conductors having the same potential of said plurality of first electrode conductors, and has a generally flat upper surface for electrically connecting to said exterior device.

4. The power converter according to claim 3, wherein said first connection conductors are made up of a first metal plate disposed so as to extend over said generally flat upper surfaces of said plurality of first electrode conductors having the same potential.

5. The power converter according to claim 4, wherein said generally flat upper surface of said first connection conductor for electrically connecting to said exterior device is configured so as to expose from the upper surface of said sealing material.

6. The power converter according to claim 5, wherein said first electrode conductors have a pillar shape extending upwards, and also upper surfaces of said first electrode conductors having said pillar shape are formed generally flat.

7. The power converter according to claim 6, said electrode connection conductor comprising:
   a second electrode conductor which is disposed on the lower surfaces of said plurality of power conversion semiconductor devices, connects, of a plurality of said electrodes positioned on the lower surfaces of said plurality of power conversion semiconductor devices, said electrodes having the same potential; and
   a second connection conductor which is electrically connected to said second electrode conductor, and also disposed so as to extend more upward than said plurality of power conversion semiconductor devices, and has a generally flat upper surface for electrically connecting to said exterior device.

8. The power converter according to claim 7, wherein said second connection conductor has a pillar shape extending upwards, and also the upper surface of said second connection conductor having said pillar shape is formed generally flat.

9. The power converter according to claim 8, wherein said power converter main unit further includes said electrode connection conductor;
and wherein said second connector conductor having said pillar shape is disposed near an edge portion of said power converter main unit.

10. The power converter according to claim 9, wherein said generally flat upper surface of said second connection conductor for electrically connecting to said exterior device is configured so as to expose from the upper surface of said sealing material.

11. The power converter according to claim 1, said electrode connection conductor comprising:
a plurality of first electrode conductors which are electrically connected to a plurality of electrodes positioned in upper surfaces of said plurality of power conversion semiconductor devices, and have a generally flat upper surface; and
a first connection conductor which is disposed on upper surfaces of said first electrode conductors having the same potential so as to connect the upper surfaces of said first electrode conductors having the same potential of said plurality of first electrode conductors, and has a generally flat upper surface for electrically connecting to said exterior device;
a second electrode conductor which is disposed on lower surfaces of said plurality of power conversion semiconductor devices, and connects said electrodes having the same potential of a plurality of said electrodes positioned on the lower surfaces of said plurality of power conversion semiconductor devices; and
a second connection conductor which is electrically connected to said second electrode conductor, and also disposed so as to extend more upward than said plurality of power conversion semiconductor devices, and has a generally flat upper surface for electrically connecting to said exterior device;
wherein said generally flat upper surface of said first connection conductor, and said generally flat upper surface of said second connection conductor have mutually generally the same height.

12. The power converter according to claim 11, further comprising:
said power converter main unit including
said plurality of power conversion semiconductor devices,
said electrode connection conductor, and
said sealing material;
wherein said sealing material is provided so as to make up the outer surface of said power converter main unit.

13. The power converter according to claim 12, further comprising:
a casing provided so as to surround said power conversion semiconductor devices;
wherein said sealing material is filled into said casing so as to cover said plurality of power conversion semiconductor devices.

14. The power converter according to claim 13, wherein said casing makes up said electrode connection conductor, and also includes
a second electrode conductor which is disposed on the lower surfaces of said plurality of power conversion semiconductor devices, and is made up of a metal plate which connects said electrodes having the same potential of a plurality of said electrodes positioned on the lower surfaces of said plurality of power conversion semiconductor devices, and
a frame-shaped second connection conductor which is electrically connected to said second electrode conductor, and also disposed so as to extend more upward than said plurality of power conversion semiconductor devices, and has a generally flat upper surface for electrically connecting to said exterior device.

15. The power converter according to claim 14, further comprising:
an upper surface side electrode conductor which is electrically connected to an electrode positioned on the upper surfaces of said power conversion semiconductor devices, and has a generally flat upper surface;
wherein steps are provided to a portion facing said upper surface side electrode conductor on the generally flat upper surface of said frame-shaped second connection conductor.

16. The power converter according to claim 15, wherein said plurality of power conversion semiconductor devices include a power conversion semiconductor device made up of SiC.

17. The power converter according to claim 16, wherein said generally flat upper surface of said electrode connection conductor exposed from said sealing material is electrically connected to said wiring substrate via an elastic deformable connection member.

18. The power converter according to claim 17, wherein said elastic deformable connection member includes an elastic deformable wire-shaped metal.

19. The power converter according to claim 18, said elastic deformable connection member further comprising:
a first connection metal plate; and
a second connection metal plate, which are disposed so as to sandwich said elastic deformable wire-shaped metal;
wherein said first connection metal plate is electrically connected to said generally flat upper surface for electrically connecting to said exterior device of said electrode connection conductor;
and wherein said second connection metal plate is electrically connected to said wiring substrate.

* * * * *